US012790529B2

(12) United States Patent
Torbati et al.

(10) Patent No.: US 12,790,529 B2
(45) Date of Patent: Nov. 10, 2026

(54) THERMAL CIRCUITS BUILT IN LIQUID CRYSTAL ELASTOMERS

(71) Applicant: Impressio Inc., Denver, CO (US)

(72) Inventors: Amir H. Torbati, Westminster, CO (US); Rajib K. Shaha, Hillsboro, OR (US); Ross H. Volpe, San Diego, CA (US); Christopher M. Yakacki, Denver, CO (US)

(73) Assignee: Impressio Inc., Denver, CO (US)

( * ) Notice: Subject to any disclaimer, the term of this patent is extended or adjusted under 35 U.S.C. 154(b) by 181 days.

(21) Appl. No.: 18/273,005

(22) PCT Filed: Jan. 18, 2022

(86) PCT No.: PCT/US2022/012811
§ 371 (c)(1),
(2) Date: Jul. 18, 2023

(87) PCT Pub. No.: WO2022/155604
PCT Pub. Date: Jul. 21, 2022

(65) Prior Publication Data

US 2024/0084183 A1 Mar. 14, 2024

Related U.S. Application Data

(60) Provisional application No. 63/138,788, filed on Jan. 18, 2021.

(51) Int. Cl.

| | |
|---|---|
| ***C09K 5/14*** | (2006.01) |
| ***C09K 19/38*** | (2006.01) |
| ***H05K 7/20*** | (2006.01) |

(52) U.S. Cl.
CPC ................ *C09K 5/14* (2013.01); *C09K 19/38* (2013.01); *H05K 7/2039* (2013.01)

(58) Field of Classification Search
CPC ......... C09K 5/14; C09K 19/38; H05K 7/2039
(Continued)

(56) References Cited

U.S. PATENT DOCUMENTS 5,625,477 A * 4/1997 Wu ..................... G09G 3/3629 349/35
7,658,865 B2 2/2010 Lu
(Continued)

FOREIGN PATENT DOCUMENTS

JP 2004149722 A 5/2004
JP 2006265527 A 10/2006
(Continued)

*Primary Examiner* — Tahseen Khan
(74) *Attorney, Agent, or Firm* — Jackson Walker LLP

(57) ABSTRACT

Provided herein are liquid crystal polymers and elastomers configured to include a thermal circuit for creating thermal paths between various nodes of the thermal circuit including a heat source, a heat sink, and an insulated area or insulated body. The liquid crystal elastomers described herein may be configured to include portions of the thermal circuit with modified conductivities that meet specifications for the heat flows along thermal paths and for the temperatures of nodes in the thermal circuit. The liquid crystal elastomers described herein include modifiable thermal conductivities based on a selected alignment of directors of the liquid crystal elastomers. Described herein are methods for designing alignments of directors for several and different portions of the liquid crystal elastomer and methods to create various thermal circuits utilizing liquid crystal elastomers and polymers.

20 Claims, 8 Drawing Sheets

(58) Field of Classification Search
USPC .......................................................... 428/167
See application file for complete search history.

(56) References Cited

U.S. PATENT DOCUMENTS

| | | | | |
|---|---|---|---|---|
| 7,766,561 | B1 | 8/2010 | Mahapatra et al. | |
| 8,400,607 | B2 | 3/2013 | Cappaert et al. | |
| 9,376,606 | B2 * | 6/2016 | Chowdhury ........... | C09K 19/36 |
| 2010/0263790 | A1 | 10/2010 | Goldfinger et al. | |
| 2017/0108357 | A1 * | 4/2017 | Chang ...................... | G01D 5/34 |

FOREIGN PATENT DOCUMENTS

| | | | |
|---|---|---|---|
| JP | 2010150377 | A | 7/2010 |
| JP | 2010189521 | A | 9/2010 |

* cited by examiner

500

THERMAL CIRCUITS BUILT IN LIQUID CRYSTAL ELASTOMERS

CROSS-REFERENCE TO RELATED APPLICATIONS

This patent application claims priority from, and incorporates by reference the entire disclosure of, U.S. Provisional Patent Application 63/138,788 filed on Jan. 18, 2021.

TECHNICAL FIELD

The present disclosure relates generally to liquid crystal elastomers (LCEs) and more particularly, but not by way of limitation, to thermal circuits built in LCEs.

BACKGROUND

This section provides background information to facilitate a better understanding of the various aspects of the disclosure. It should be understood that the statements in this section of this document are to be read in this light, and not as admissions of prior art.

In general, polymers and elastomers are isotropic and are good insulators. Polymers and elastomers can be used as thermal insulators for sensitive electronics. These materials have been used in electronics and other systems, but pose various challenges due to their inherent thermally insulative properties. For example, current methods and designs for modulating and controlling the thermal conductivity of thermal paths through polymer bodies or liquid crystal elastomer bodies remains limited. In addition, current methods generally rely on the addition of composite materials into the polymer or elastomers matrix to tailor thermal conductivity, which can hinder overall performance and increase cost.

SUMMARY OF THE INVENTION

This summary is provided to introduce a selection of concepts that are further described below in the Detailed Description. This summary is not intended to identify key or essential features of the claimed subject matter, nor is it to be used as an aid in limiting the scope of the claimed subject matter.

In an embodiment, the present disclosure pertains to a liquid crystal elastomer composition having a liquid crystal elastomer body configured to include a thermal circuit that connects a heat source to a heat sink via a plurality of first thermal paths from the heat source to the heat sink through the liquid crystal elastomer body. In some embodiments, the plurality of first thermal paths includes a shortest first thermal path that is configured to be aligned with more than a first majority of directors along the shortest first thermal path. In some embodiments, the thermal circuit of the liquid crystal elastomer body is further configured to connect the heat source to an insulated body via a plurality of second thermal paths from the heat source to the insulated body through the liquid crystal elastomer body. In some embodiments, the plurality of second thermal paths includes a second thermal path that is configured to be orthogonal to more than a second majority of directors along the shortest second thermal path. In some embodiments, the thermal circuit of the liquid crystal elastomer body is further configured to connect the insulated body to the heat sink via a plurality of third thermal paths from the insulated body to the heat sink through the liquid crystal elastomer body. In some embodiments, the plurality of second thermal paths includes a shortest third thermal path that is configured to be orthogonal to more than a third majority of directors of the shortest third thermal path.

In an additional embodiment, the present disclosure pertains to a liquid crystal elastomer composition having a liquid crystal elastomer body configured to include a thermal circuit having an insulated body node interface portion of the liquid crystal elastomer body. In some embodiments, the insulated body node interface portion contains directors configured to be aligned parallel to an interface edge of the insulated body node interface portion.

In a further embodiment, the present disclosure pertains to a method of creating a liquid crystal elastomer body with a heat sink interface edge that is orthogonal to a director orientation of the liquid crystal elastomer body. In general, the method includes extruding a portion of liquid crystal ink through a nozzle. In some embodiment, the extruding thereby applies a shear force to the liquid crystal ink that is: (1) sufficient to align a director orientation of the liquid crystal ink by the shear force; and (2) directed to be orthogonal to the heat sink interface edge of the liquid crystal elastomer body. In some embodiments, the method further includes crosslinking the extruded portion of liquid crystal ink into a portion of liquid crystal elastomer with the director orientation via illuminating with an ultraviolet light the extruded portion of liquid crystal ink after it leaves the nozzle.

In an additional embodiment, the present disclosure pertains to a method of creating a liquid crystal polymer body with a heat sink interface edge that is orthogonal to a director orientation of the liquid crystal polymer body. In general, the method includes placing a liquid crystal mesogen mixture prepared with a non-stoichiometric ratio of functional groups for a Michael addition reaction into contact with a heat sink interface molding surface, reacting the liquid crystal mesogen mixture until the reaction stops due to the non-stoichiometric ratio while the liquid crystal mesogen mixture is in contact with the heat sink interface molding surface, thereby creating a midpoint liquid crystal polymer body with excess unreacted functional groups that contains the heat sink interface edge in contact with the heat sink interface molding surface, straining the liquid crystal polymer body in a direction away from the heat sink interface edge, and exposing the midpoint liquid crystal polymer body with excess unreacted functional groups to a cross-linking stimulus configured to react a population of the excess unreacted functional groups, thereby creating the liquid crystal polymer body with the heat sink interface edge.

In another embodiment, the present disclosure pertains to a method of creating a liquid crystal polymer body with an insulator interface edge that is aligned with a director orientation of the liquid crystal polymer body. In general, the method includes placing a liquid crystal mesogen mixture prepared with a non-stoichiometric ratio of functional groups for a Michael addition reaction into contact with an insulator interface molding surface, reacting the liquid crystal mesogen mixture until the reaction stops due to the non-stoichiometric ratio while the liquid crystal mesogen mixture is in contact with the insulator interface molding surface, thereby creating a midpoint liquid crystal polymer body with excess unreacted functional groups that contains the insulator interface edge in contact with the insulator interface molding surface, straining the liquid crystal polymer body in a direction parallel to the insulator interface edge, and exposing the midpoint liquid crystal polymer body with excess unreacted functional groups to a cross-linking stimulus configured to react a population of the excess unreacted functional groups, thereby creating the liquid crystal polymer body with the insulator interface edge.

In a further embodiment, the present disclosure pertains to a method of creating a liquid crystal polymer body with a heat sink interface edge that is orthogonal to a director orientation of the liquid crystal polymer body. In general, the method includes applying an anchoring agent to a heat sink interface molding surface, placing a liquid crystal mesogen mixture prepared with a non-stoichiometric ratio of functional groups for a Michael addition reaction into contact with the heat sink interface molding surface, reacting the liquid crystal mesogen mixture until the reaction stops due to the non-stoichiometric ratio while the liquid crystal mesogen mixture is in contact with the heat sink interface molding surface, thereby creating a midpoint liquid crystal polymer body with excess unreacted functional groups that contains the heat sink interface edge in contact with the heat sink interface molding surface, and exposing the midpoint liquid crystal polymer body with excess unreacted functional groups to a cross-linking stimulus configured to react a population of the excess unreacted functional groups, thereby creating the liquid crystal polymer body with the heat sink interface edge.

BRIEF DESCRIPTION OF THE DRAWINGS

A more complete understanding of the subject matter of the present disclosure may be obtained by reference to the following Detailed Description when taken in conjunction with the accompanying Drawings wherein:

FIG. 2A shows $K_z > K_x = K_y$.

DETAILED DESCRIPTION

The following description and drawings are illustrative and are not to be construed as limiting. Numerous specific details are described to provide a thorough understanding. However, in certain instances, well-known or conventional details are not described to avoid obscuring the description. References to one or an embodiment in the present disclosure are not necessarily references to the same embodiment; and, such references mean at least one. Reference in this specification to "one embodiment" or "an embodiment" or the like means that a particular feature, polymer composition, design structure, or characteristic described in connection with the embodiment is included in at least one embodiment of the disclosure. The appearances of the phrase "in one embodiment" or the like in various places in the specification are not necessarily all referring to the same embodiment, nor are separate or alternative embodiments mutually exclusive of other embodiments. Moreover, various features are described that may be exhibited by some embodiments and not by others.

Described herein are methods and designs for modulating and controlling the thermal conductivity of a plurality of thermal paths through a liquid crystal polymer (LCP) body or a liquid crystal elastomer (LCE) body that create the thermal circuit therein. As described herein, an LCE is used as a specific instantiation of an LCP, which may include incompletely crosslinked networks, such as LCPs excess unreacted functional groups. For example, as described herein, LCPs with controlled conductivity can include lowered thermal conductivity between an insulated body and a heat source or heat sink designed to give or receive heat through the thermal circuit. As described further herein, the LCE body is designed to restrict heat transfer through the thermal circuit to the insulated body (e.g., to limit heat received from the heat source and/or heat given to the heat sink) while encouraging heat transfer along thermal paths between the heat source and the heat sink by modulating the thermal conductivities along these various thermal paths.

By creating particular arrangements of directors within the LCE material, described herein are embodiments with longer thermal paths that have higher conductivity than shorter thermal paths. Additionally, described herein are embodiments of thermal paths with higher conductivity that are adjacent to thermal paths that have low or relatively no conductivity. Furthermore, described herein are embodiments of mapped thermal paths through the LCE body created with novel arrangements of directors such that each portion contains a directional anisotropy of thermal conductivity to create these thermal paths.

Figure 1:
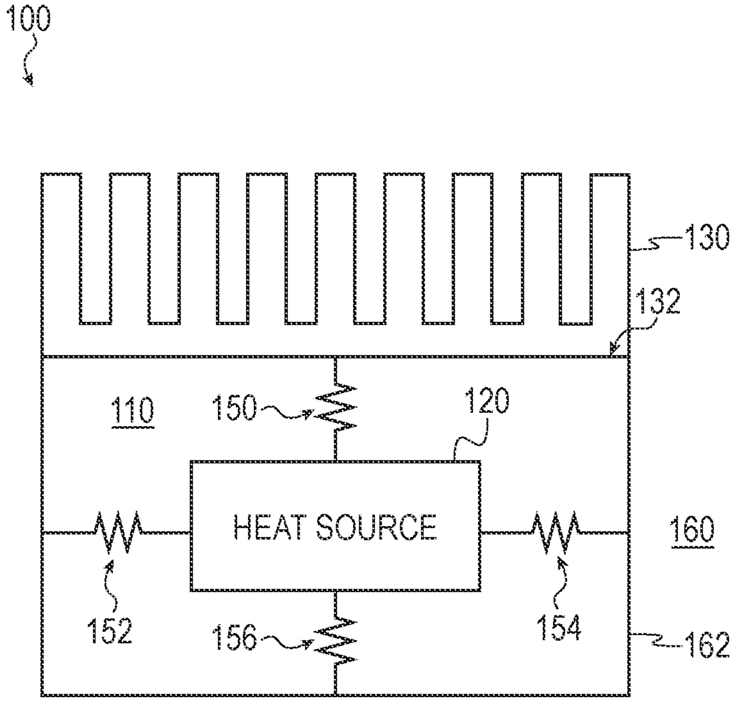
FIG. 1 illustrates a layout of a liquid crystal elastomer (LCE) body created as described herein to include a thermal circuit between a heat source, an insulated body, and a heat sink.

FIG. 1 shows a layout of an LCE body 110 created as described herein to include a thermal circuit between a heat source 120, an insulated body 160, and a heat sink 130. In one embodiment, the heat source 120 is packaged inside the LCE body 110 that includes a thermal circuit, and the heat source could be a light-emitting diode (LED) chip package that has certain requirements for transparency through the LCE and/or for low distortion transmission of light on certain sides of the LCE body. For example, the bottom of the LCE could be a particularly important optical output direction and therefore that side of the LCE packaging must be particularly transparent and/or have low optical distortion or dispersion. In some embodiments of the heat source 120, the heat source is sensitive to heat buildup and the heat source must have a certain heat outflow in order to maintain a correct operating temperature of the heat source 120. One such example is an LED chip package that may overheat without a certain heat flow from the heat source 120 to a heat sink 130. These, and other boundary requirements, can define the design of a thermal circuit in the LCE body 110.

The embodiment shows a thermal circuit design with a heat source 120, such as an LED package inside an LCE body 110, covering the heat source 120. The thermal circuit may be defined through equivalent thermal resistors 150, 152, 154, and 156 between the heat source 120 and respectively a heat sink node interface 132, and three different edges of the insulator node interface 162. As described further herein, portions of the LCE 110 can include portions that are more transparent or have lower optical distortion than other portions of the LCE. The equivalent thermal resistors 152, 154, and 156 each connect with an environment 160 surrounding the LCE. In one embodiment, the requirements to keep thermal resistances 152, 154, and 156 high and to keep heat flow from the heat source 120 to the environment 160 low through the interface 162 means that thermal resistance 150 should be kept low to facilitate heat flow from the heat source 120 to the heat sink 130 through the interface 132. According to several embodiments described herein, heat flow may be directed through many equivalent thermal resistances via the selection of LCE director alignments for many of the critical thermal paths between the nodes on the thermal circuit.

Physical boundary requirements of the LCE may include, for example, that the LCE should fill all of the space between the heat source 120 and the heat sink 130, as well as a defined outer envelope 162 that serves as an interface with the outside environment 160 (e.g., air). In the embodiment shown herein, there is a requirement that the boundary interface 162 with the outside environment 160 receives only a low heat flow and therefore this embodiment treats the environment 160 as an insulated body and the interface 162 as an insulated node interface edge. In the example of the heat source 120 being an LED light source, the requirement of the interface 162 not to receive heat flow may be based on an optical requirement that the interface remains non-distorted over an operating temperature range, operating power dissipation range, or operating output range for the heat source 120.

As such, thermal paths are designed in the thermal circuit of the LCE as generally represented by the thermal resistors 150, 152, 154, and 156 representing the respective resistances to heat flow between the heat source 120, the heat sink 130, and the insulated body 160 (or area/environment). These different thermal resistances may be matched to the operating requirements of the heat source 120 as well as the heat flow requirements of the boundary interfaces 132 and 162 and nodes of the thermal circuit, such as the heat sink 130. For example, resister 150 will strongly affect heat flow between heat source 120 and heat sink 130 across the interface 132 and that heat flow will establish operating parameters that are able to be maintained by the thermal circuit, such as operating temperatures of the heat source and heat sink respectively, as well as the heat flow through resister 150 between those two nodes when they are at those operating temperatures. The thermally resistive properties of the thermal paths between the nodes of the thermal circuit built inside the LCE allow for novel configurations of thermally resistive paths that can create lower resistance paths that have a longer thermal path length than higher resistance thermal paths. Thermal circuits built in LCEs as described herein may have their thermal properties varied within their uniform LCE material using the techniques of selective director alignment inside the LCE body to create these different thermal conductivities. The effect of these alignments on the thermal paths may be described with standard notation of thermal conductivity, which may be compared directly or in its inverse as a resistivity, such as shown with equivalent thermal resistors 150, 152, 154, and 156 in FIG. 1.

Figure 2A:
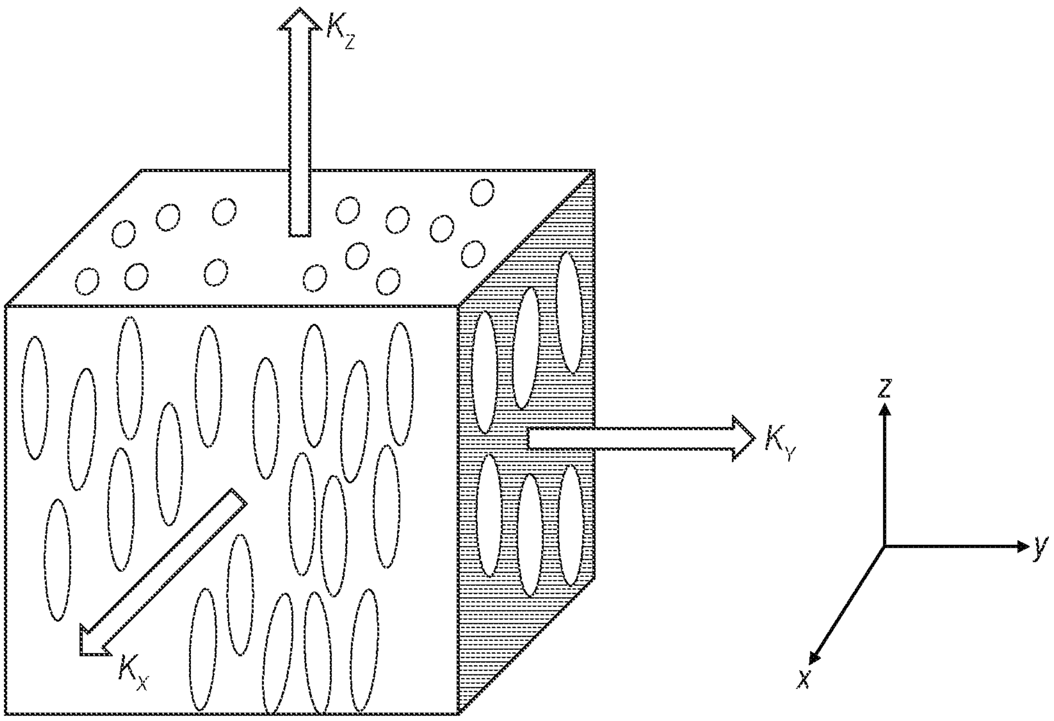
FIG. 2A illustrates an embodiment of thermal anisotropy created by controlling the orientation of directors for a portion of an LCE along a thermal path.

FIG. 2A shows an embodiment of anisotropy of thermal conductivity (K) created by controlling the orientation of directors for a portion of the LCE body. Described herein are ways of modulating the LCE to creating particular thermal paths with different properties. The thermal conductivity K is noted in the figure along three directions: Kx along an X-axis, Ky along a Y-axis, and Kz along a Z-axis. These different conductivities are related to the orientation of the directors of the mesogens of the LCE aligned along the Z-axis, as illustrated in FIG. 2A. This mesogen director alignment along the Z-axis is therefore an orthogonal alignment to heat flows (and thermal paths) that flow either along the X-axis and along the Y-axis and a parallel alignment for heat flows along the Z-axis. As described herein, modulation of the conductivities along the heat path is created herein by modulating the orientation of the directors with respect to those heat flows. In this embodiment, calamitic, or rigid rod, mesogens are used to form a nematic liquid crystal elastomer. In other embodiments, other mesogens, such as discotic, or liquid crystal phases, such as smectic, could be used.

For example, the director orientation that is shown aligned with the Z-axis is parallel both to thermal interface surfaces that are parallel to the X-Z plane as well as thermal interface surfaces that are parallel to the Y-Z plane. This will minimize thermal conductivities flowing along the X-axis and/or the Y-axis. The director orientation may be parallel to two coordinate planes and orthogonal to a third coordinate plane. As another example, a thermal interface surface that is parallel to the X-Y plane is orthogonal to the director orientation that is shown aligned with the Z-axis. A thermal interface surface may be any surface connecting a thermal node of the thermal circuit to the interface portion of the thermal circuit created in the LCE, as described herein. Therefore, there may be many interface edges contained within any interface surface and director orientations are described further herein with respect to both interface surfaces and interface edges.

A conductivity that is exhibited by the LCE body in the direction Kz is significantly different than the conductivity exhibited in the directions Ky and Kx. In one embodiment, including an LCE synthesized from a functionalized mesogen of 4-(3-acryloyloxypropyloxy)benzoic acid 2-methyl-1,4-phenylene ester; 2-Methyl-1,4-phenylene-bis[4[3(acryloyloxy)propyloxy]benzoate], the thermal conductivity anisotropy exhibited by the LCE includes a 100% increase in conductivity along the orientation of the directors when compared to conductivity orthogonal to the orientation of the directors. Other embodiments of LCE materials may provide a greater anisotropy of thermal conductivities based on the director orientation and measure of director alignment, such as an order parameter of the LCE material between 0 and 1. As described herein, different thermal conductivities may be achieved with orthogonal orientations and with parallel orientations with respect to the thermal paths by creating the LCE with different alignments. Similarly, intermediate conductivity values may be achieved by orienting the directors at an angle (e.g., between 0-90 degrees) to the thermal path. As described further herein, different anisotropies exhibited by different LCE materials may influence different patterns of directors in the LCE thermal circuits when those properties are combined with other requirements such as heat flows into and out of the node interfaces of the LCE.

As described herein different and complex strains may be applied to LCPs. Different strain percentages described herein can create different order parameters for the directors in the LCPs. The order parameter of an LCP is a measure of an average of director orientation of the liquid crystal molecular axis with a preferred direction or with a measured direction (e.g., the thermal path being evaluated through the LCP). As described further herein, this measurement of an order parameter may also be described herein as a percentage of directors oriented along the measured direction. A larger strain will create a larger order parameter with respect to the direction of the strain, and many different percentages of director orientations and order parameters are described herein that may be created through using complex and different strains in the LCP.

The unit volume of LCE shown in FIG. 2A may be representative of a unit portion of a thermal path length. As described further herein, these unit lengths may be very short and include small portions of the LCE body. As described further herein, multiple thermal paths may exist in parallel to each other and they may each transmit heat between node interfaces edges through the LCE body. The shortest thermal path between node interface edges may be particularly designed to be thermally insulating or thermally conductive. As described herein, the thermal paths created by design of the orientation of directors along the thermal paths through an LCE body may include multiple three-dimensional thermal paths, such as expansions of certain areas, including via a thickness dimension. This thickness dimension may be added to the two-dimensional representations of LCE bodies shown herein. These embodiments of LCEs shown in the figures include two-dimensional representations of three-dimensional LCE bodies. The descriptions herein of the two-dimensional figures may be understood to include variable thicknesses that also affect the thermal resistance of certain thermal paths between nodes in a thermal circuit.

By creating particular arrangements of directors within the LCE material, longer thermal paths have been created that have higher conductivity than shorter thermal paths. Furthermore, thermal paths have been created with higher conductivity that are adjacent to thermal paths that have low thermal conductivity or relatively no thermal conductivity. Additionally, a thermal circuit has been created on which heat may flow by creating the LCE body with novel arrangements of directors—each portion of LCE in the LCE body contains a directional portion of the thermal circuit between the nodes.

Figure 2B:
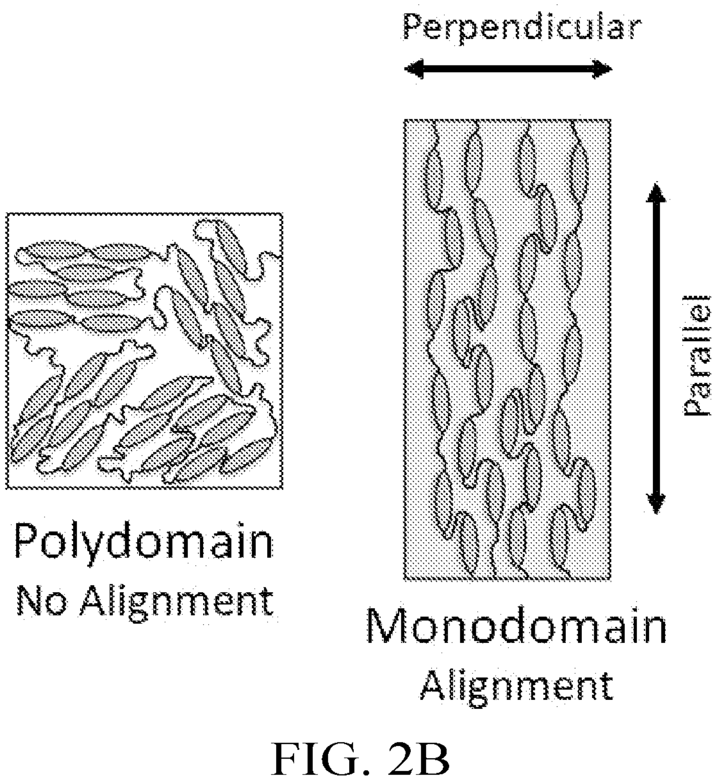
FIG. 2B illustrates various configurations of an LCE. The polydomain configuration has no global alignment, demonstrated by mesogens forming randomly oriented liquid crystal domains. Conversely, the mesogens of the monodomain LCE are oriented along a director.
Figure 2C:
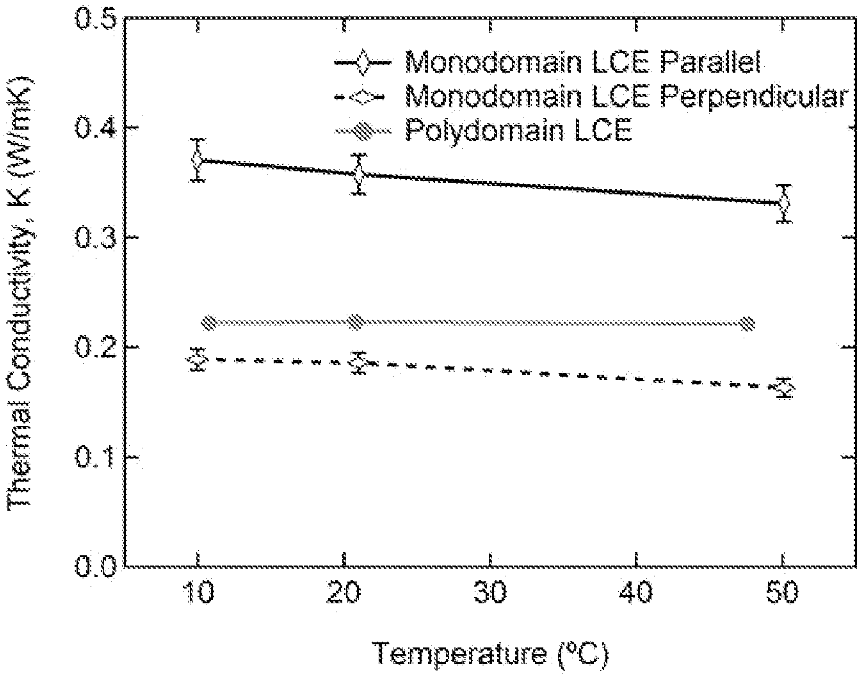
FIG. 2C illustrates thermal conductivity and temperature plots for a monodomain LCE (parallel), a monodomain LCE (perpendicular), and a polydomain LCE measured in two orthogonal directions.

FIG. 2B shows various configurations on an LCEs. Polydomain samples have no global alignment, while monodomain samples have global alignment of mesogens. The two configurations were then tested for thermal properties, some of which are illustrated in FIG. 2C.

Testing demonstrated that a polydomain LCE sample, which lacks any long-range directional orientation (i.e., a global director), has uniform thermal conductivity in both directions measured. The thermal conductivity stayed nearly constant with increasing temperature. Conversely, the monodomain samples showed directional dependence. Parallel to the director, the thermal conductivity was ~2× higher than in the perpendicular direction. With increasing temperature, there was a slight decrease in thermal conductivity for both directions tested. This could potentially be because monodomain samples try to contract along the director slightly when heated (and a slight change in geometry may influenced the reading). Various methods of producing monodomain samples exist; however, it should be noted, this property is not inherent to LCEs. One must program and synthesis LCEs in a specific fashion to induce a monodomain structure. Otherwise, polydomain structures are inherently formed. As such, this property is not inherent to the material chemistry. It is dependent upon the process, or orienting the liquid crystals (or mesogens) during synthesis.

Thermal conductivity, diffusivity, and/or specific heat per unit volume were measured on: (1) LCE monodomain (21 mm×16 mm×1 mm), aligned along the direction of width; (2) LCE monodomain (21 mm×16 mm×1 mm), aligned along the direction of length; and (3) LCE polydomain (21 mm×16 mm×~1.5 mm). Results for the LCE monodomain are as follows: Thermal conductivity parallel to director orientation=0.35 W/mK; Thermal conductivity perpendicular to director=0.18 W/mK; Thermal diffusivity parallel to director orientation=0.167 $mm^2/s$; and Thermal diffusivity perpendicular to director orientation=0.087 $mm^2/s$. Thermal transport properties for the LCE polydomain are illustrated below in Table 1.

TABLE 1

Thermal transport properties of LCE polydomain.

| Thermal Properties | Standard Hot Disk Method | Hot Strip Method |
|---|---|---|
| Thermal Conductivity (W/mK) | 0.223 | 0.23 |
| Thermal Diffusivity ($mm^2/s$) | 0.11 | 0.11 |
| Specific Heat ($MJ/m^3K$) | 2.02 | 2.12 |

In addition, thermal conductivity, thermal diffusivity and/or specific heat per unit volume were measured on: (1) LCE monodomain (21 mm×16 mm×1 mm), aligned along the direction of width (i.e., perpendicular to the director); (2) LCE monodomain (21 mm×16 mm 5×1 mm), aligned along the direction of length (i.e., parallel to the director); and (3) LCE polydomain (21 mm×16 mm×~1.5 mm). Thermal transport properties of LCE monodomain samples is shown below in Table 2, while thermal transport properties of LCE polydomain samples is shown below in Table 3.

TABLE 2

Thermal transport properties of LCE monodomain at different temperature.

| Temperature (° C.) | Thermal Conductivity Along the Director (W/mK) | Thermal Diffusivity Along the Director ($mm^2/s$) | Thermal Conductivity Across the Director (W/mK) | Thermal Diffusivity Across the Director ($mm^2/s$) |
|---|---|---|---|---|
| 9.99 | 0.3707 | 0.1749 | 0.1886 | 0.0889 |
| 21 | 0.3578 | 0.1688 | 0.1857 | 0.0875 |
| 50.07 | 0.3311 | 0.1562 | 0.1632 | 0.077 |

TABLE 3

Thermal transport properties of LCE polydomain at different temperature.

| Temperature (° C.) | Thermal Conductivity (W/mK) | Thermal Diffusivity ($mm^2/s$) | Specific Heat ($MJ/m^3k$) |
|---|---|---|---|
| 10.75 | 0.2222 ± 0.0004 | 0.1154 ± 0.0012 | 1.926 ± 0.02 |
| 20.8 | 0.2229 ± 0.00067 | 0.1099 ± 0.0007 | 2.029 ± 0.0078 |
| 47.57 | 0.2214 ± 0.0007 | 0.1087 ± 0.0015 | 2.037 ± 0.02 |

Figure 3:
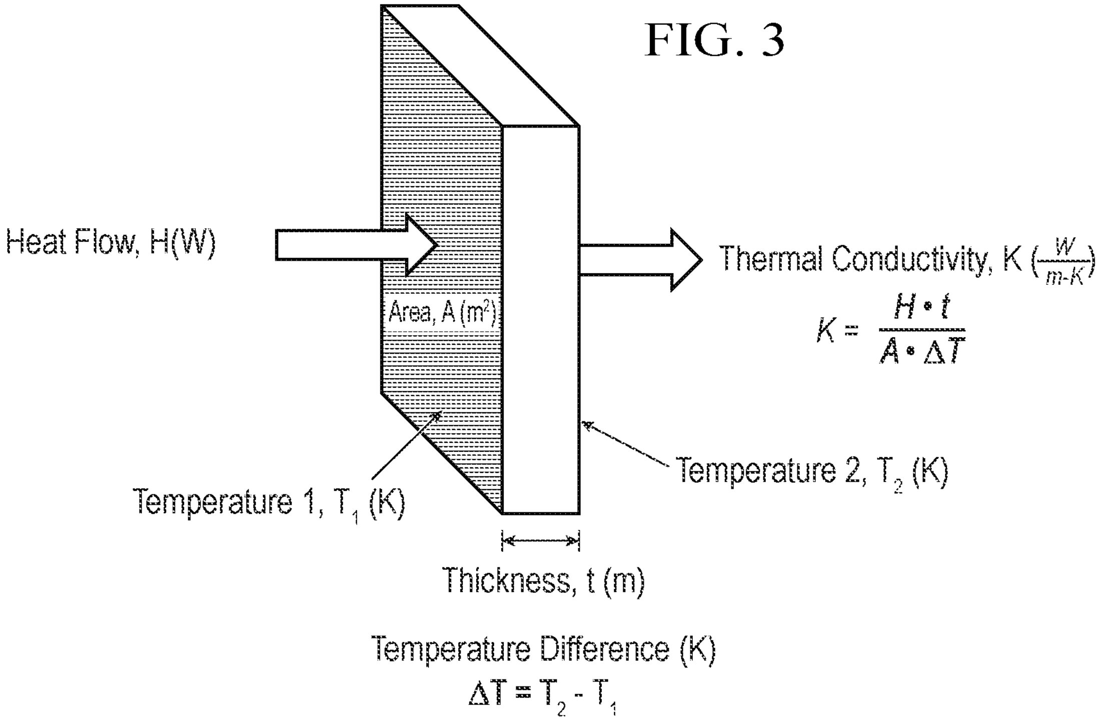
FIG. 3 illustrates heat transfer specifications, including general terminology for describing heat transfer, and a thermal circuit created thereby.

FIG. 3 illustrates heat transfer specifications, including general terminology for describing heat transfer, and a thermal circuit created thereby. FIG. 3 shows standard terminology for describing heat flow that is governed by thermal conductivity (K) which is equal to the heat flow (H) multiplied by the thickness (t) of the conductive body through which the heat flows divided by a product of the area (A) of the conductive body (e.g., area of the interfaces) and the difference in temperature of the two interfaces (ΔT). The two interfaces illustrate unit portions of a thermal circuit, presumed for purposes of calculation and/or operation with ability to handle the heat flow H while maintaining a consistent temperature between the interfaces of the nodes.

Because any thermal path includes a non-zero cross sectional area, each thermal path described herein includes a unit area. Therefore, a shortest thermal path will include associated unit area of the surrounding LCE body for determining the thermal conductivity of that path. Along a thermal path includes a portion of the LCE body that is within a unit polygon or a unit area around and related to the shortest path connecting two nodes of the thermal circuit.

Although the thickness and unit area classically described in thermal transfers describe length scales in units of meters, embodiments described herein for thermal circuits may include thermal paths with much smaller length scales such as 10 micrometers, 100 micrometers, 1 millimeter, 10 millimeters, and other short length scales. Therefore, thermal paths described herein include small cross-sectional areas; however, these cross-sectional areas and the related discussion of the actual thermal path include a cross-sectional area for that heat to flow as described and shown further herein. Multiple heat paths are included in the drawings although individual specific heat paths may be described and are readily envisioned. Therefore, the designs for specific directors shown in the figures define different embodiments of thermal paths, including the real-world thickness of the designs shown in cross-section. Each of the descriptions herein for director orientations of the LCE bodies and their related thermal paths of the thermal circuit created therein include the complete and related descriptions of embodiments of various general options for the created thermal paths which may be combined between parts of the different embodiments of LCE bodies.

There are a great number of thermal paths even through a small cross-sectional area through any material, including LCEs. For example, a heat-dissipating thermal circuit for a heat source that is an electronic circuit that needs to spread heat from a source that has a certain input area and dissipate that heat to a heat sink that has another certain area. The length scale of the LCE body may be very small, including as small as about 10 micrometers to a few millimeters (e.g., 10 micrometers to 10 millimeters) and lengths of portions of the thermal paths may be only fractions of length scale. Additionally, the thickness of the LCE body may be as thin as 10 or 100 micrometers.

Despite these length scales for thermal paths being very short, the differential in heat flows attained by the selectively-oriented LCEs described herein can create strongly directional thermal circuits and support the maintenance of the desired temperatures of the nodes of the circuit. As described further herein, short thermal paths may still be highly thermally resistive because of the insulating properties of the LCE along those short thermal paths. Therefore, a likely unit of measurement for an area of smallest thermal path may be a small area, such as 10 micrometers by 10 micrometers, or 100 square micrometers for a similarly short thermal path of 10 micrometers or 100 micrometers. In one such embodiment, the LCE body is a thin film of LCE providing directional thermal protection and heat flow for a thermal circuit with a heat source, a heat sink, and an insulated area.

Therefore, the length scales of these thermal paths described further herein with respect to director orientation may be very short. Certain measurement techniques may be used for discerning director orientation such as probing with polarized light or probing with X-ray diffraction (e.g., wide angle X-ray scattering, small angle X-ray scattering). These may include samples of 1 millimeter or more to create a result with a discernable orientation of the directors from a sample of the portion of the LCP body. Therefore, in some embodiments with very small length scales, additional copies of the thermal path may be used to multiply or replicate the effect (e.g., X-ray diffraction) of the directors along the thermal path, such as via layering multiple units of the thermal path, in cases where a singular thermal path's length scale is too short to discern the director orientation along the thermal path using the particular technique for probing the director orientation.

The embodiments described herein include definitions of a majority of director orientations directed as related to certain thermal paths, with director orientations of a majority of directors such as 50%, 55%, 60%, 65%, 70%, 75%, 80%, 85%, 90%, 95%, 97%, 99%, and 99.5% of directors as measured by measurement techniques including using polarized light or X-ray diffraction. In some embodiments, the measurement techniques may indicate a percentage, an order parameter, or other measurement data that may be converted or interpreted as another measurement of the director orientations in an LCE sample described herein. In some embodiments, these majorities of directors may be defined as having a monodomain along the orientation of that majority of directors.

For purposes of calculation in the thermal circuit, nodes are considered to have thermal conduction within the node sufficient that the temperature of the node boundary is consistent across the node interface. A node interface (e.g., a boundary) of the LCE as described herein includes the portion of the LCE configured to contact the node at the node interface. Therefore, the node itself is not included in the description of the node interface or the node interface boundary of the thermal circuit built in LCE. In some instances, a single physical body may be treated as an ideal thermal node, providing heat at a single consistent temperature at all interface surfaces for the node body. In other instances, such as when extreme heat transfers can create temperature differences along different points of a node interface, a node may be modelled as one or more nodes. For example, a heat sink with sufficient thermal conduction between portions of the heat sink (e.g., made of a thermally conductive metal) to withstand the heat flows absorbed may be modelled under certain conditions as having a singular temperature interface and a singular node in the thermal circuit.

Under other operating conditions, the heat sink may include two or more nodes. For example, in response to an extreme heat transfer into one portion of the heat sink, the heat sink interface may heat up around that portion of the heat sink and cause a rise in temperature compared to other portions of the heat sink. In these cases where heat flow overloads the node requirements for heat flow (e.g., heat flow out of a heat source, heat flow into a heat sink, heat flow in either direction with respect to an insulated body), multiple nodes may be created due to overloading on those different thermal paths causing a change temperature with respect to separate portions of the node. In this instance, a second node could be created, allowing for a refinement of the circuit to allow for excess heat flow to or from that portion of the node and to adjust that flow as needed by creating a new LCE director orientation and thermal circuit between all the nodes.

Therefore, from the thermal circuits built in an LCE described herein including a generalized heat source, a generalized heat sink and a generalized insulated body, any number of the designs may be made to include any thermal circuit that can be made using resistive material and any of the several boundary restrictions described herein. In additional embodiments, LCE bodies described herein may include more complex thermal circuits built into the including interfaces and thermal paths for multiple nodes, for incompletely-defined nodes or distributed nodes such as parasitic heat sources or heat sinks, or for non-direct heat sources such as radiation absorption.

In additional embodiments, the thermal circuit built in LCE may include interfaces for a smaller number of nodes such as having only two nodes, such as a heat source node interface and a heat sink node interface without a defined insulated body/area node interface to protect from heat flow in the thermal circuit. In another embodiment, a thermal circuit in the LCE may include only interfaces for two nodes, including insulated body node interface and a heat sink node interface, such including embodiments where a heat source is unknown or distributed within the body of the LCE. As described herein, there are many ambient node interfaces, for example through contact of the air around an interface edge of the LCE body. As described further herein, these node interfaces with an ambient or outside environment may include requirements have that are ancillary to the thermal requirements including optical clarity and uniform heating requirements.

In other embodiments, the LCE body may have directors oriented to create exclusively insulating portions of an LCE adjacent to the node interface edges of the LCE body. In alternative embodiments, based on the requirements of the thermal circuit and the LCE material's anisotropic properties, the directors in the rest of the LCE body between the node interfaces may be oriented in a direction that further insulates node interface edges from each other. As one example of an LCE body with insulating node interface surfaces(s), an LCE body may include opposite facing surface(s) (e.g., top and bottom, left and right) that are required to thermally insulate from heat flows through the surface(s), and to or from the rest of the LCE. In this embodiment, the portion of the LCE proximal or adjacent to the node interface edge has directors oriented parallel to their interface edge. Based on the insulating properties of the LCE, other portions of the LCE body may have directors configured in an insulating orientation with respect to these node interface edge(s) or may be oriented in another direction for another property of the LCE.

Figure 4:
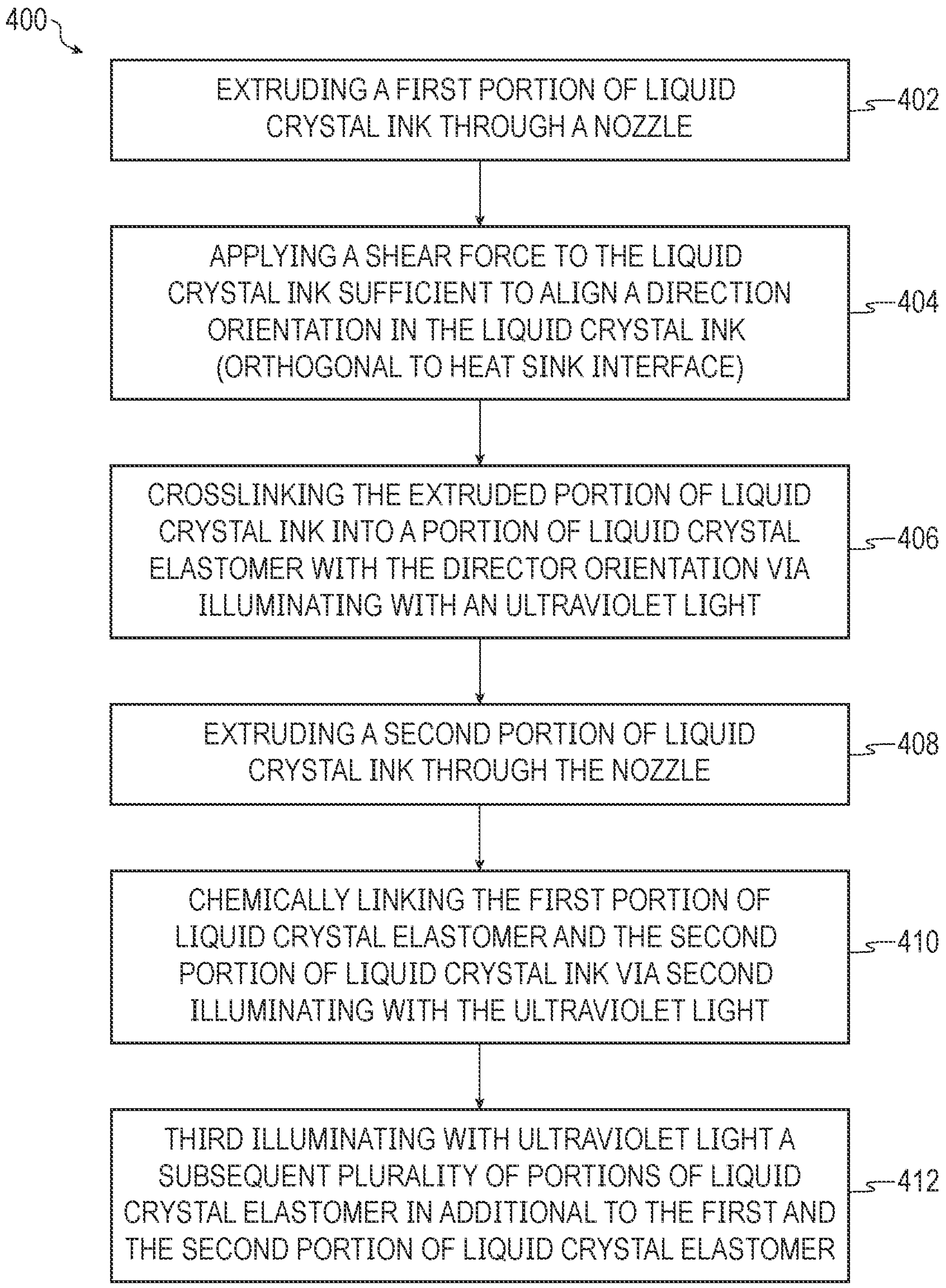
FIG. 4 illustrates a flow chart of a method of creating an LCE composition as described herein.

FIG. 4 shows a flow chart of a method of creating an LCE composition as described herein. The method 400 describes a method for creating a particular arrangement of director orientations within the LCE body extruding a portion of liquid crystal ink 402 through a nozzle and imparting a shear force 404 to a liquid crystal ink while extruding the ink through the nozzle, thereby controlling the orientation of directors in the LCE to align with the direction of the shear force. The shear force is sufficient to align 404 the directors in the liquid crystal ink along the direction of the force before the ink is exposed 406 to a crosslinking stimulus, such as light in embodiments of liquid crystal ink including a photo-initiator. In one embodiment, the crosslinking step 406 is caused by exposing the liquid crystal ink to ultraviolet (UV) light. This exposure can be configured to crosslink 406 the liquid crystal ink into an LCE while the directors are oriented along the direction of the shear force applied 404 by the nozzle when the ink was extruded 402.

After crosslinking 406 by initiating crosslinking (such as with exposure to UV light), the method may include second extruding 408 a second portion of liquid crystal ink through the nozzle. This second portion of liquid crystal ink that is second extruded 408 may touch the first portion of the LCE that was previously crosslinked 406. After extruding the second portion 408 of the liquid crystal ink through the nozzle, the second portion of liquid crystal ink may be exposed 410 to a cross linking initiator, such as UV light. If the second portion of liquid crystal ink is in contact with the first portion of the LCE, in some embodiments, the second illuminating will chemically link 410 the second portion of the liquid crystal ink and the first portion of the LCE. In some embodiments, the first illuminating of the first portion of the liquid crystal ink with the UV light is adapted to leave unreacted parts of the first portion of liquid crystal ink. In these embodiments, these unreacted parts of the first portion of liquid crystal ink allows for additional chemical linking between the first portion of the LCE and the second portion of liquid crystal ink via the process step of second illuminating them both with UV light.

Subsequent to the second extruding 408 of a second portion of liquid crystal ink through the nozzle, a subsequent large plurality of portions of liquid crystal ink may be extruded, including parts of the liquid crystal ink that remain not completely crosslinked in order to increase the chemical linking between the different portions of the LCE created by a plurality of crosslinking steps. Therefore, the extruding step 408 and the chemically linking step 410 may be repeated over a large plurality of repetition cycles to create a larger and more complex LCE body. The direction of the shear force applied in the extruding steps each apply a shear force to each of the portions liquid crystal ink and therefore control the orientation of the directors in the portions of the liquid crystal ink as they are extruded through the nozzle. As described further herein, entire bodies of LCE material may be created with individual director orientations applied to the minimum portion of LCE ink that is available to be extruded 404 and 408 through the nozzle. These portion sizes of liquid crystal ink and LCE may include very small monodomains of director orientation which may have their orientations aligned with or orthogonal to a thermal path of the LCE as described further herein. For example, the embodiments shown herein of thermal circuits built into LCE bodies, the director orientations are controlled over a large area and may be constructed incrementally through additive manufacturing techniques such as extruding liquid crystal ink out of a nozzle to control directors on a small length scale controllable by the printing nozzle.

In some embodiments the method includes a third illuminating step 412 of the LCE body with UV light after the plurality of portions of liquid crystal ink have been extruded 402 and 408 and chemically linked 410 together. In many embodiments, there are a large number of portions of liquid crystal ink chemically linked together in the LCE bodies described herein. This third illuminating step 412 with UV light may be designed as a final cure phase for the entire LCE body including this large number of portions. The third illuminating step 412 may be performed all over the LCE body, at a higher intensity or energy of ultraviolet light, and for a long period of time (e.g., one hour, several hours) to ensure that any populations of remaining unreacted or non-crosslinked mesogens of the LCE are fully crosslinked by the third illuminating step.

Figure 8:
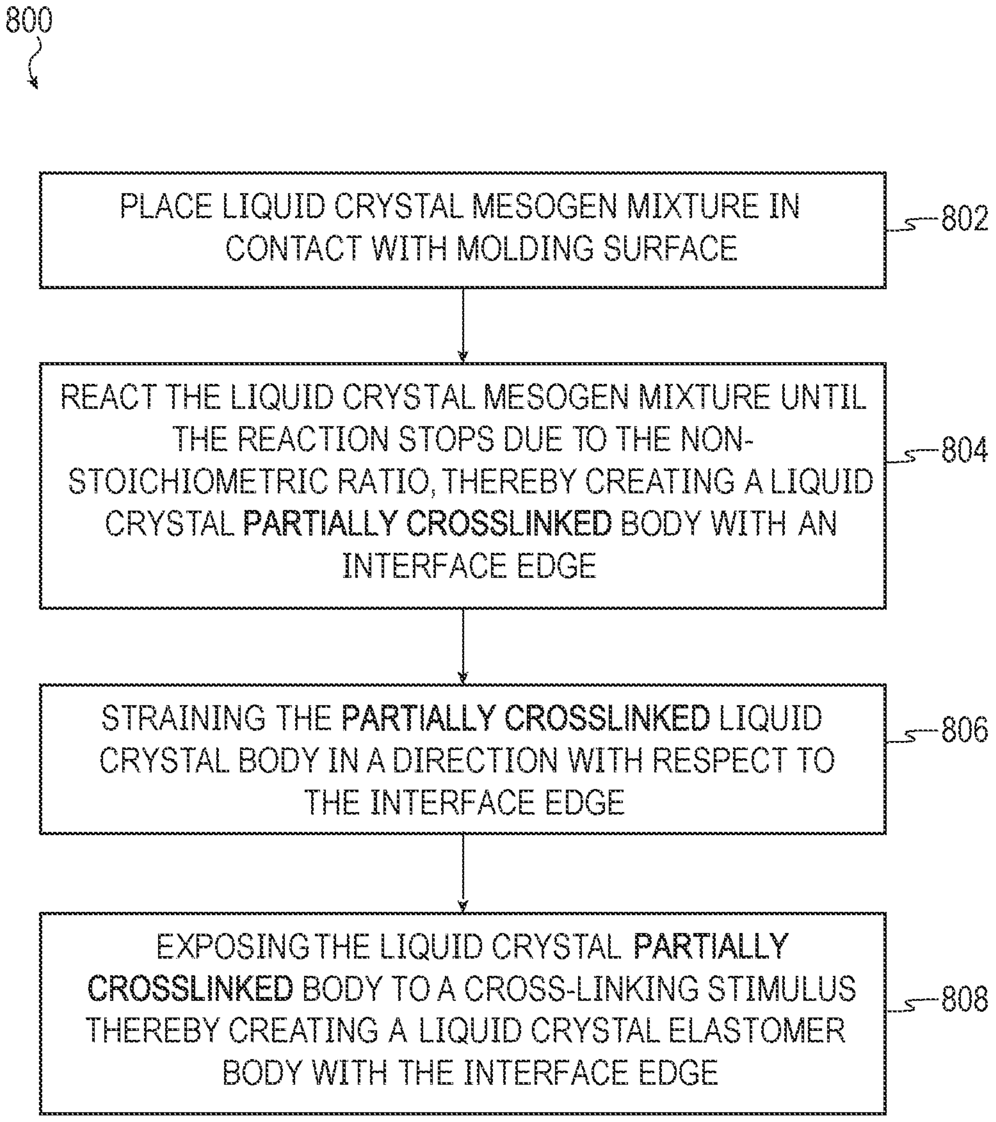
FIG. 8 illustrates a flow chart of a method of creating a liquid crystal polymer (LCP) body as described herein.

FIG. 8 shows an embodiment of a flow chart of a method 800 for creating an LCP body as described further herein. The method includes placing 802 a liquid crystal mesogen mixture in contact with an interface molding surface, thereby defining an interface edge in the liquid crystal mesogen mixture. The method then reacts 804 the liquid crystal mesogen mixture until the reaction stops due to a non-stoichiometric ratio of functional groups in the mesogen mixture, thereby creating an LCP body with excess unreacted functional groups. The method then strains 806 the LCP body in a direction with respect to the interface edge (e.g., orthogonal to, parallel to, at an oblique angle to). The method then exposes 808 the LCP body with excess unreacted functional groups to a cross-linking stimulus, thereby reacting the unreacted functional groups and creating an LCP body with the interface edge.

In one embodiment, the liquid crystal mesogen mixture that is placed 802 in contact with an interface molding surface is a liquid crystal mesogen mixture containing a non-stoichiometric ratio of functional groups (e.g., containing functional groups with an excess population, acrylate functional groups in excess of thiol functional groups). Such a limited reaction may be described via a Michael addition reaction. In one embodiment, these functional groups of the mesogen mixture may be thiol groups and electron-deficient groups (e.g., acrylate groups) and the non-stoichiometric ratio may include an excess of acrylate groups. In this embodiment, the mesogen mixture may be first reacted 804 such that thiol and acrylate groups react until the thiol groups have reacted with the acrylate groups (e.g., to completion, after a period of time), thereby creating an LCP body having additional unreacted functional acrylate groups. In other embodiments, other chemistries of the liquid crystal mesogen mixture may be used including different functional groups, including with a different secondary cross-linking stimulus.

Other Michael addition reactions may be used herein. For example, other ways of creating a non-stoichiometric ratio of functional groups (e.g., thiol groups, acrylate groups) may be used with these described methods, including, for example, a solution including a single complex mesogen that includes both thiol and acrylate functional groups. The reactions described herein have been demonstrated with non-stoichiometric acrylate-to-thiol group ratios greater than 1:1 and less than 2:1. Particularly, solutions with a non-stoichiometric ratio of 1.15:1 were used for many of the examples herein.

The method 800 then reacts 804 the liquid crystal mesogen mixture until the Michael addition reaction stops due to having reacted all or nearly all of one of the stoichiometrically matched functional groups in the mixture, thereby creating an LCP body with a portion of unreacted functional groups. For example, reacting 804 the liquid crystal mesogen mixture in contact with the interface molding surface creates an interface surface of the LCP body (e.g., containing an interface edge) that is contacting (e.g., pressed against) the interface molding surface and that has excess unreacted functional groups.

In one embodiment, the interface molding surface is a solid surface. In other embodiments, the interface molding surface may be a flexible surface, such as a compliant bladder or a fluid (e.g., air). In one embodiment, to maintain contact with the molding surface, a pressure (e.g., a force, a stress) is maintained between the interface molding surface and the mesogen mixture while reacting 804 the mesogen mixture.

In one embodiment, the LCP body with unreacted functional groups remains in contact with the interface molding surface after the first stage of the Michael addition reaction (e.g., after completing the first reacting step 804). In another embodiment, the LCP body may be removed from contact with the interface molding surface after completing the step of reacting 804.

The method 800 then strains 806 the liquid polymer body with respect to the interface edge. The LCP with excess unreacted functional groups may be strained 806 to align the director orientation of the polymer with the direction of the strain. The unreacted functional groups may thereafter be exposed 808 to a crosslinking stimulus while the strain is maintained (e.g., with the same strain, with a different strain) in order to fix and lock the director orientation in that direction. This newly-locked orientation of the directors may be expressed as a shape fixity in the LCP, as described herein.

For example, the macroscopic property of shape fixity is another measure (e.g., percentage) of the fixed director orientation that is created by the exposing 808 step (e.g., cross-linking step). Shape fixity may be defined as the ratio of fixed strain to applied strain. Fixed strain is remaining after the exposing 808 step and after release of the strain from the LCP (e.g., removing the LCP from the straining apparatus). The applied strain used for the calculation is a constant strain that was applied during the straining 806 step. In some embodiments, the applied strain during the straining 806 step used for the calculation is an average of the strain applied or a midpoint of the strain applied. In other embodiments, the applied strain is a maximum applied strain during the straining 806 step.

Shape fixity after the exposing step may reach 90%, 95%, or more, such as for example, where the LCP maintains a 270% strain or greater after release of the straining apparatus that enforces a constant 300% strain (e.g., removing the LCP from a jig). As described further herein, the LCPs herein may have strains aligned in multiple directions and/or have multiple strain percentages around a node interface edge, as well as throughout the LCP body. Therefore, the shape fixity after these strains must be accounted for when sizing the initial creation 804 of the node interfaces of the LCP body before straining 806 because the node interface surface will retain a large portion of the strain applied by the process.

Strains imparted 806 herein are described as orthogonal to, parallel to, and oblique to an interface edge with a node of the thermal circuit. As described further herein, the conductivity of the LCP is maximized for heat flows in the direction along or parallel to the director orientation, whereas the conductivities are minimized for heat flows in the direction orthogonal to the director orientation. Furthermore, there are intermediate conductivities for angles of heat flow that are oblique to the director orientation (e.g., in between orthogonal and parallel to the director orientation).

Multiple directions of strain may be applied 806 to different portions of the LCP, including complex maps of director orientations described further herein to create complex thermal circuits through the LCP. Similarly, the thermal circuit node interfaces (e.g., heat sink interfaces, insulator interfaces, heat source interfaces) may have complex shapes of the node interfaces, therefore requiring complex apparatus or complex jigs to maintain the straining 806 of the LCP. In some embodiments, the straining 806 of the LCP is continued to be performed throughout the step of exposing 808 the LCP to a crosslinking stimulus. In other embodiments, straining 806 may be released prior to the completion of the exposing 808 step. In still other embodiments, straining 806 may include applying different levels of strain and/or different applications of stress during the exposing 808 step.

Complex strains and complex shapes of node interfaces that are required for different embodiments herein may be created using appropriately designed jigs or stretching apparatus. In alternative embodiments, the LCP may be strained 806 with complex strains to create complex patterns of director orientations, as described further herein. For example, shown herein are certain thermal circuit nodes with circular or curved interface surfaces and these curved surfaces may require curved jigs or curved stretching apparatus to apply strains in certain directions with respect to a node interface edge. For example, a circular node interface surface may be strained circumferentially (e.g., strained around the circumference of the curved interface edge) by being pressed on an apparatus that expands the circumference. The shapes of the interface edges described herein may be regular or irregular. For example, a cone apparatus may be used for expanding the circumference of a circular node interface, thereby straining the LCP in a direction tangential to the circle at each point, and therefore parallel to the interface edge (e.g., creating an insulating node interface).

Complex stretching apparatus may create different strains (e.g., different amounts, different directions) along the interface edge. As one example, the heat source 702 node interface edge shown in FIG. 7 may create different strain concentrations around portions of the circumference of the interface edge, depending on the apparatus used to strain the LCP portions of the heat source node interface. As another example, a thin film with two broad surfaces of the film and a small height dimension may be stretched in one or more directions along a surface of the film (e.g., orthogonal to the height dimension of the thin film) and therefore create a director orientation that is parallel to the surface of the film, which may also serve as an insulator interface node interface.

In alternative embodiments, the LCP may be strained 806 in a direction away from the interface edge in order to create an orthogonal director orientation with respect to the interface edge. In some embodiments, as described further herein directions at an angle other than orthogonal to or parallel to the thermal circuit node interface edge may be used to create different conductivities adjacent to that interface edge.

In some embodiments, the apparatus or jig for straining the LCP may attach to an attachment-aiding portion of the LCP body. This attachment-aiding portion may be used for the straining 806 step (e.g., transmitting the strain, equalizing the strain along the interface edge) and may be intended to be removed after the straining 806 is no longer needed. For example, a thin film may have an attachment-aiding portion that allows the thin film to be strained along its thin dimension using an attachment-aiding portion attached to its thin dimension for processing and the attachment-aiding portion is later removed (e.g., after the straining 806 step is completed, when the straining has reduced). As another example, one larger LCP thin film portion with excess unreacted functional groups may be created 804, strained 806, and exposed 808 to cross-linking stimulus before segmenting the large LCP thin film into many smaller thin films. In this embodiment, many of these thin films act as attachment-aiding portions for the other smaller thin films. Attachment portions may be modified to create different strain concentrations across the interface edge of the LCP based on the straining 806 step, including increased concentrations of strains or equalizations of strains near the interface edge.

The method 800 then exposes 808 the LCP with excess unreacted functional groups to a crosslinking stimulus that is configured to react the excess unreacted functional groups in the LCP. As described further herein, this exposure 808 and resultant crosslinking creates fixity in the director orientation. In some embodiments, partially exposing 808 the LCP with excess unreacted functional groups results both in a partial cross-linking of the excess unreacted functional groups and in a partial shape fixity for the resulting LCP. A lack of shape fixity in the unreacted functional groups in an LCP portion can affect the order parameter of that portion and the conductivity of that portion, creating a middle value between the maximum and minimum conductivities. In one embodiment, the crosslinking stimulus described herein includes exposing the LCP to UV light in order to react the excess unreacted functional groups. In one embodiment, a cross-linking initiator is included in the mesogen mixture for reacting the unreacted functional groups.

Different embodiments of Michael addition reactions and mesogen mixtures may include different crosslinking initiators to complete the Michael addition reaction and to fix the director orientation while aligned with the strain applied 806. For example, for a thiol acrylate mesogen mixture that includes excess acrylate, a cross-linking photoinitiator may be used to react the unreacted acrylate functional groups remaining in the LCP. The thiol-acrylate chemistries described herein are one example of the many potential liquid crystal mesogen mixtures capable of using a Michael addition step reaction described herein in order to create complex maps of director orientations in the LCP.

In various embodiments, a thin layer of LCE and/or LCP can create a flexible electronic (e.g., thermal circuit, flexible display). In such embodiments, bending strains for thin films have a very small influence on overall director orientation, due to bending strains of thin films being inherently low. In some embodiment, the flexible electronic is a display, and the LCE and/or LCP material is transparent. In another embodiment, the flexible electronic is a thermal circuit.

Figure 9:
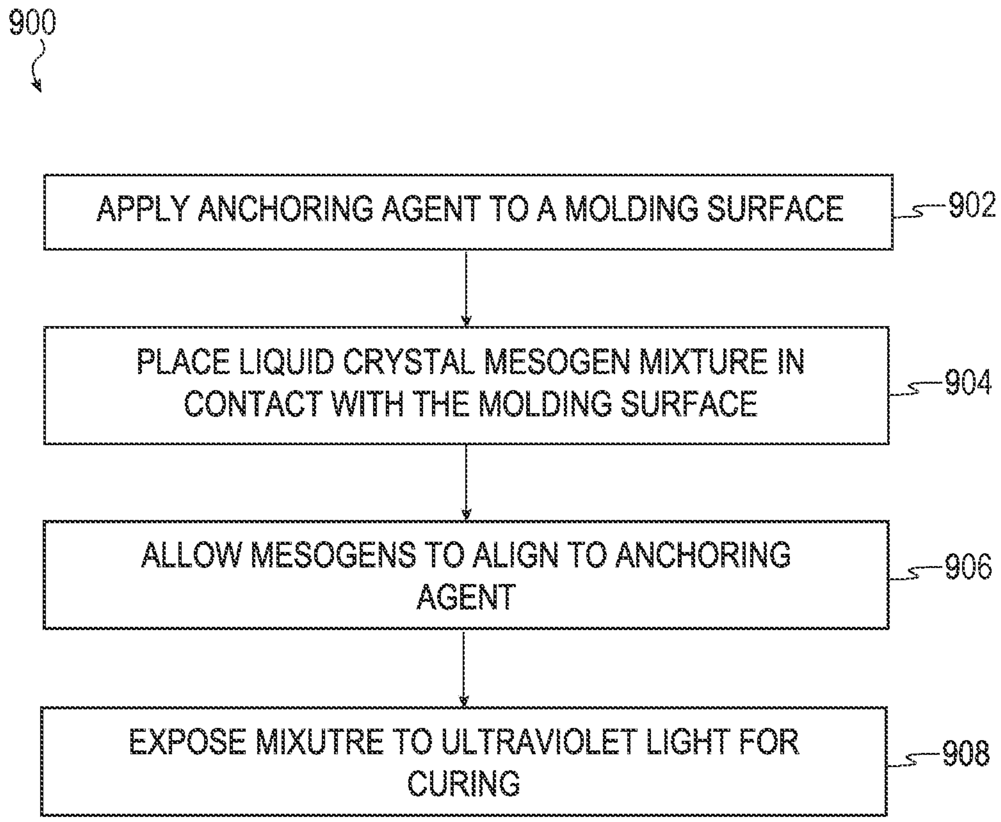
FIG. 9 illustrates a flow chart of a method for surface anchoring as described herein.

FIG. 9 shows a process 900 relating to surface anchoring according to aspects of the disclosure. Process 900 starts with applying an anchoring agent to a molding surface 902. In some embodiments, the anchoring agent is homeotropic to create alignment perpendicular to the mold surface. In some embodiments, the anchoring agent is planar to create alignment parallel to the mold surface. In some embodiments the anchoring agent is polyimide or polyamide. After the application 902 of the anchoring agent, a liquid crystal mesogen mixture is placed in contact with the molding surface 904. The mesogen mixture is allowed time to align to the anchoring agent 906. Subsequent the contacting and aligning of 904 and 906 of the liquid crystal mesogen mixture with the molding surface, the mixture is exposed to UV light for curing 908. In some embodiments, the planar anchoring agent is rubbed with felt to induce a director profile for the thermal circuit.

Figure 5:
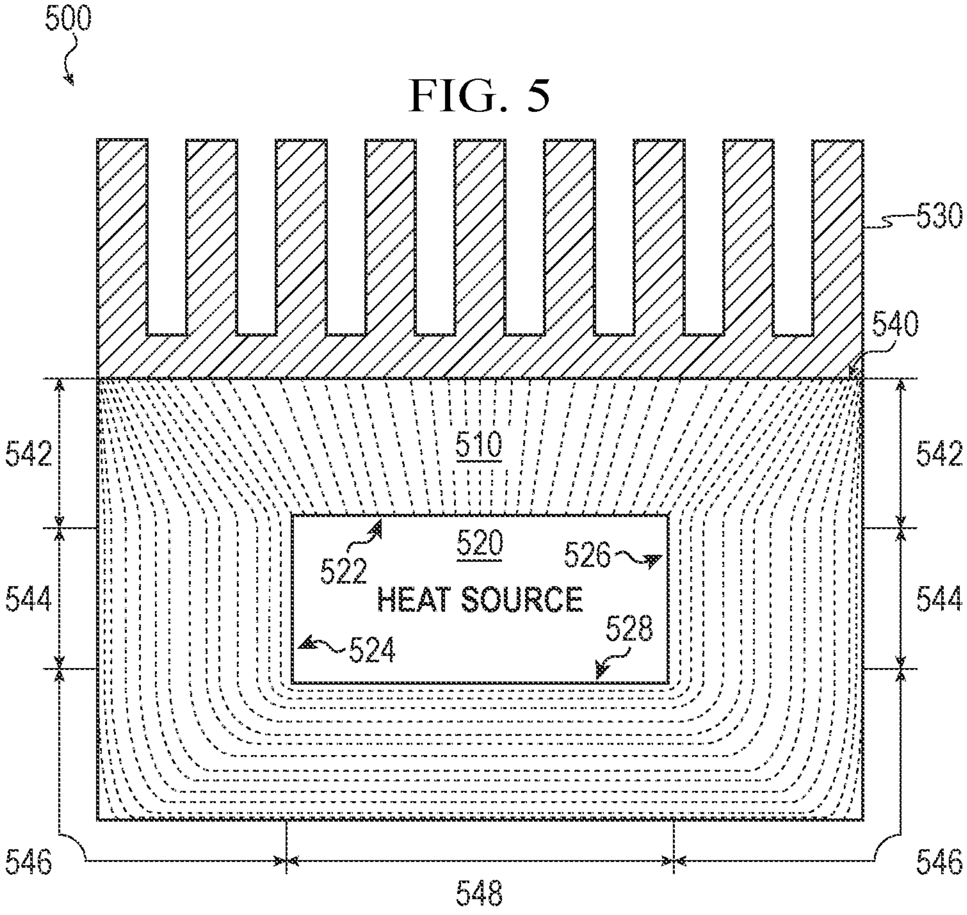
FIG. 5 illustrates an embodiment of a thermal circuit built in an LCE configured for use in embodiments where a heat source is closer to a heat sink than to an insulated body.

FIG. 5 shows an embodiment of a thermal circuit built in LCE configured for use in embodiments where a heat source is closer to a heat sink than to an insulated body. The LCE body 510 is an enclosure of the heat source 520, which in several embodiments could be a solid-state element or source of light such as an LED. For example, the solid-state element could be a microprocessor or integrated circuit sitting in thermal contact with the heat sink, as separated above the rest of an electronics board, which may include thermally sensitive equipment and thus is an insulated body node or an insulated area node in the thermal circuit.

The LCE body 510 shows director orientations within the LCE for several different portions of the thermal circuit and effective thermal paths from the heat source 520 through the LCE body 510 to various interfaces with the environment, such as the interface 540 with the heat sink 530 and the main window interface 548 with the exterior environment such as air or another fluid. In one embodiment, the heat source 520 may be an LED and the main window interface 548 may be a relatively transparent and distortion-free aperture through which radiation from the LED may exit.

The embodiment shown of the thermal circuit built in an LCE includes parallel director orientation for the LCE along portions adjacent to three of the heat source interface edges 524, 526 and 528. In embodiment shown, the director orientation parallel to the interface edges remains uninterrupted along the shortest thermal path between the heat source 520 and portions of the LCE interface with the outside environment such as interface portions 544 and 548. In one embodiment, the parallel director orientation is formed as a monodomain in the LCE to create relative transparency or clarity through portions of the LCE interface with the outside environment, including interface portions 544 and 548.

In the embodiment shown, the director orientations of the LCE body 510 that are adjacent the interface edges 524, 526, and 528 are respectively parallel to those interface edges thereby creating a high thermal resistivity portions of the LCE around the heat source 520. This extra insulation around three sides of the heat source 524, 526, and 528 requires a greater portion of the heat flow carrying requirements to be carried by thermal paths between the interface edge 522 with the heat source 520 and the interface edge 540 with the heat sink 530. However, for this embodiment, this configuration with lowered heat carrying capacity is chosen in order to create regions of greater optical transmission and clarity through the LCE body 510 for several portions of the LCE body 510 configured for transmitting light from the heat source to the outside environment.

The thermal paths of the LCE body 510 between interface edge 522 with the heat source 520 and interface edge 540 with the heat sink 530 are designed to have directors oriented mostly orthogonally to the interface edge 522 with the heat source, with an angle of deviation from orthogonal in this embodiment designed for the heat spreading portions of the LCE body 510. In these heat spreading regions, directors deviate from orthogonal by a small angle to spread heat and adapt between the different lengths of interfaces 522 and 540. These heat spreading portions of the thermal circuit adapt the length difference between the heat source top interface edge 522 through the LCE body 510 with directors creating conductive thermal paths that spread the heat over a greater length of the interface 540 with the heat sink 530. Heat spreading via these spreading thermal paths may be accomplished by spreading into one or more dimensions as needed for each portion of the respective interfaces 522 and 540.

The extent of the deviation from orthogonal to the interface 522 may be determined by the requirements of the heat source 520 node in the thermal circuit and other requirements of the LCE body 510. As described further herein, other requirements for the LCE such as clarity and or transparency of the LCE may further refine the selection of orthogonal directors in certain portions of the LCE body 510. In some other embodiments therefore, other portions of the LCE body 510 may have all or substantially all directors aligned to create clarity in the portion, such as embodiments as described herein for portions of the LCE between interface 528 with the heat source and the main window interface 548 between the LCE body 510 and an outside environment. For example, in one embodiment, in order to increase clarity through portions in the LCE adjacent to interface portion 542, the LCE may remove some or all shifts in director orientation in the portion of the LCE body 510 along the interface edge 522 and in portions of the LCE body 510 between the heat source 520 and the heat sink 530. In some embodiments, a monodomain may be formed of directors adjacent to an interface edge of the node interface of the LCE body 510, such as a monodomain aligned with the interface edge or a monodomain aligned orthogonal to the interface edge.

Other boundary conditions for the LCE and the thermal circuit can be accounted for as well in the embodiments of thermal circuits described herein. For example, the equal lengths of the shortest thermal paths between the heat source interfaces 524, 526, and 528 and the LCE interface portions 544 and 548 are an effect of these interfaces being parallel and they are shown as only one embodiment. Real interfaces may present an array of lengths for thermal paths, including a singular shortest thermal path between interfaces as shown in further examples of node interfaces and different lengths of thermal paths. As another example of boundary conditions, the LCE body 510 may be required to fill the physical space (e.g., no air gap, to provide physical support) between an insulated body and the heat source and/or the heat sink. As another example of boundary conditions affecting the thermal circuit, a limited amount of LCE may be possible to be fit between a heat source and a heat sink, therefore requiring additional conductive and circuitous thermal paths through the thermal circuit described with respect to different embodiments herein. Other boundary conditions may include insulated bodies positioned between the heat sink and heat source, or with shorter thermal paths to the heat sink and heat source through the LCE than the thermal paths between the heat sink and heat source through the LCE. Many potential requirements and design parameters are described herein for designing the thermal circuits and LCE bodies to meet both thermal conduction requirements and other physical requirements of the thermal circuit built in the LCE.

Portions of the interface of the LCE body 510 with the outside environment (e.g., air, another fluid) include certain portions that may have requirements separate from thermal requirements (e.g., clarity based on director orientation) or requirements that are related to the thermal requirements (e.g., clarity related to being relatively free from thermal distortions). A main window LCE interface portion 548 is shown at a portion of the LCE interface with the outside environment over a portion of LCE that is aligned to be relatively transparent through the LCE from the heat source interface 528 and out the interface portion 548. In the embodiment shown, the parallel alignment of directors in the portions of LCE adjacent to the main LCE interface 548 and the side windows 544 ultimately decreases heat dissipation away from the heat source (e.g., through interfaces 524, 526, and 528) in exchange for increased clarity in the window portions, thereby interrelating some of the requirements for design of this LCE body 510.

The LCE body 510 shows corner interface portions 546 of the interface between the LCE with the outside environment. In the embodiment shown, there may be additional requirements for heat flow between the heat source and the corner portions 546 of the interface may continue to be insulated to meet a continued requirement of low heat flow even though a requirement of optical clarity maybe not imposed for these interfaces 546. For example, an optical path through interface 546 to the heat source through the LCE may include multiple director orientations and may therefore lack relative transparency with respect to the rest of the LCE. In one embodiment, the corner interfaces 546 must still receive only low heat flow from the heat source, for example, because the LCE package is designed not to heat up or cause thermal warping and therefore the portions of LCE between the heat source 520 and the interfaces 546 are still required to be insulating body node interfaces. Therefore, despite the lack of optical clarity for the LCE body under these interfaces 546, the interfaces themselves may still be insulated based on the tangential orientations of directors radiating to interfaces 546 from the corners of the heat source interface edge 524, 526, and 528.

Several embodiments of the LCE body 510 and of other LCE bodies shown herein include a significant thickness dimension for which the directors may be selected similarly to the discussions herein of in-plane of thermal paths. Many of the drawings showing mesogen orientation herein only include one plane and the descriptions should be understood to include the three-dimensional nature of the thermal paths with non-zero cross-sectional areas. Thermal paths may also move within three dimensions and the shortest thermal path may be measured as a path traversing three dimensions.

Figure 6:
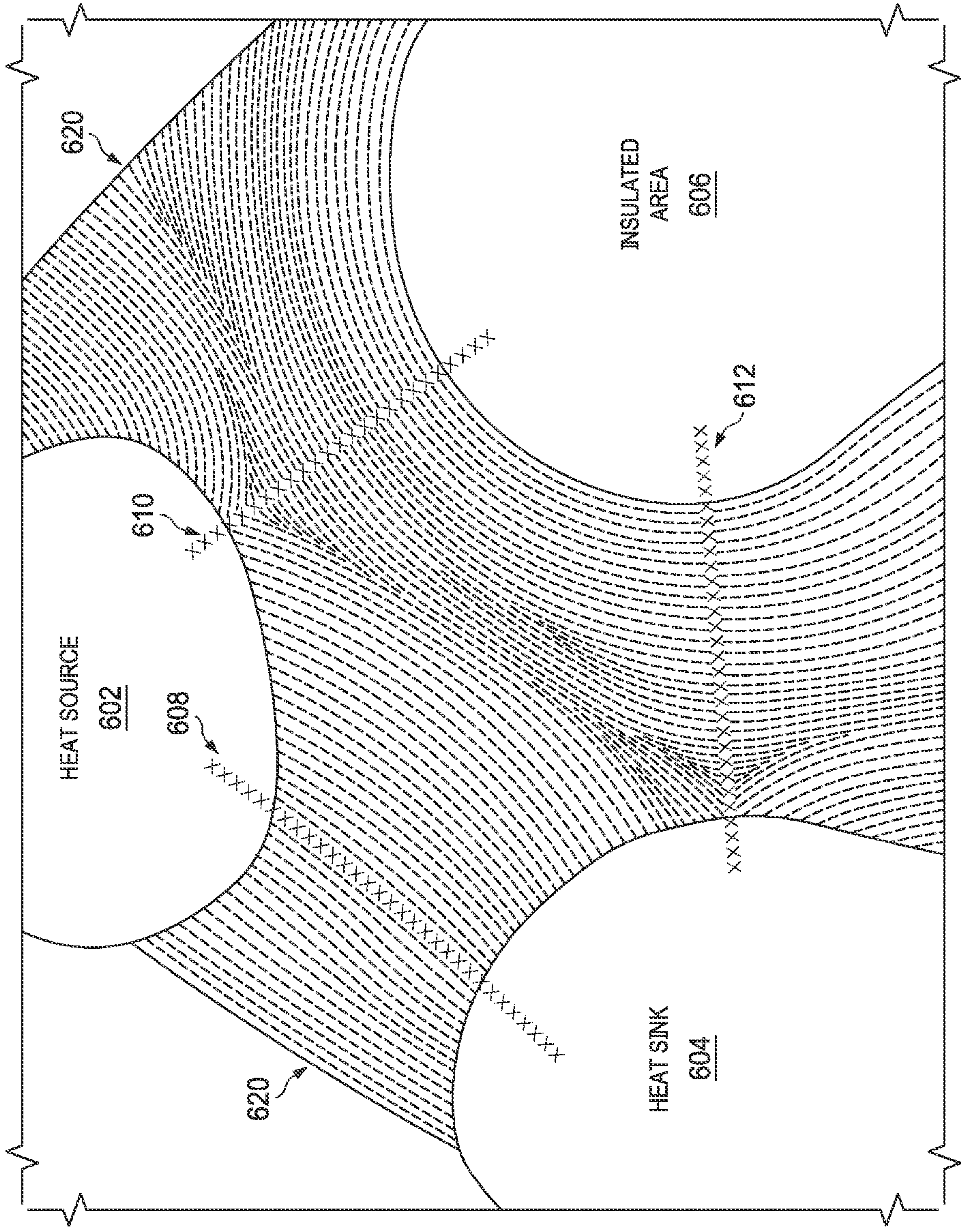
FIG. 6 illustrates an embodiment of a thermal circuit built in an LCE body configured for use in embodiments where a heat source is located at a similar distance away from a heat sink as its distance to an insulated body or insulated area.

FIG. 6 shows an embodiment of a thermal circuit built in the LCE body configured for use in embodiments where a heat source 602 is located at a similar distance away from a heat sink 604 as the distance to an insulated body or insulated area 606. Each of the nodes are shown with a shortest thermal path 608, 610, and 612 through the LCE between the nodes.

The orientation of directors around these shortest paths often defines a dominant thermal path of conduction (e.g., conducting the most heat) based on the heat flow equation and the dominance of the form factor elements (e.g., length and area of path). However, the shortest thermal path may not be the dominant thermal conduction path due to the conductivity along that path that is controlled and modulated via director orientation. These thermal paths are further described herein based on how these conductivities are adjusted via director orientation to control which path is the dominant thermal conduction path and to utilize longer paths for conduction for dominant heat flows.

The LCE body includes a complex thermal circuit that balances heat flows from the nodes based on conductivity and length, while also meeting certain boundary requirements including heat flow requirements of the nodes 602, 604, and 606. Additional requirements for the LCE body as well as physical requirements of the boundaries 620 of the LCE body as well as requirements that the LCE to fill the volume between the node interfaces 602, 604, and 606 (e.g., no air gaps for insulation). Although there are many thermal paths between each of the nodes, for brevity of description, only the orientations of directors along the shortest thermal paths 608, 610, and 612 are described in detail. The orientations of other directors to create the other thermal paths may be extrapolated from these descriptions, as shown in the figures and described further herein. In some cases, described further herein, thermal paths are redundant or dominated by other paths so little or no heat flow will occur. For those dominated paths with no significant heat flow, there is no thermal requirement for the LCE body and other non-thermal requirements may dictate the LCE design for that portion.

In one embodiment, the shortest thermal path 608 is a straight line. As described herein, the shortest thermal path through the LCE body is a shortest thermal path including a surrounding cross-sectional area that may be drawn with the shortest thermal path through the LCE body. Therefore, in one embodiment, the shortest thermal path is a curved path, including a cross-sectional area for thermal conduction along that path. For example, the shortest thermal path maybe a curved path in instances where there are boundary constraints that limit the ability of the shortest thermal path to be a straight line and that cause the shortest path to follow a curved path (e.g., an edge of the LCE body) through the LCE body between two nodes. Whereas alternate thermal paths may add to the heat carrying capacity of the thermal circuit between nodes, the shortest thermal paths 608, 610, and 612 between those nodes are described herein for the purposes of describing the orientation of the directors along those shortest thermal paths. These paths are particularly germane because they are likely candidates for dominant thermal paths of heat flows between the nodes and therefore may be greatly affected in their operation by adjustments in thermal conductivity.

As described further herein, various thermal requirements of the nodes (e.g., heat flows, operating temperatures) may influence different embodiments of director alignments along the shortest thermal paths. For example, these thermal requirements such as described further herein for node heat flows may influence decisions whether to include a portion of LCE with directors parallel to a shortest thermal path at node interface or whether to include only directors orthogonal to the shortest thermal path (and tangential to the node interfaces). Therefore, multiple alternate embodiments herein include descriptions based a population of directors in alignment or a degree of alignment of the directors along portions of those paths. In addition, director orientations may be described relating to only portions of the thermal path that are adjacent to interfaces and/or portions of the thermal path that are closer to a node interface or further away from another.

The LCE body along the shortest thermal path 608 between the heat source 602 in the heat source sink 604 creates a dominant thermal path through the LCE body being configured in a director orientation causing high conductivity along the path. In one embodiment, the director orientation causes high conductivity along the entirety of the thermal path from the interface edge with the heat source 602 to the interface edge with the heat sink 604. In some embodiments, the director orientation along the shortest thermal path 608 between the heat source 602 in the heat sink 604 may include a monodomain of directors or multiple portions of monodomains aligned along the shortest thermal path.

The LCE body along the shortest thermal path 610 between the heat source 602 and the insulated area 606 includes the majority of director orientations that are orthogonal to the shortest thermal path thereby creating a largely insulating thermal path. However, as described further herein there are portions of the shortest thermal path 610 that include directors aligned along the thermal path, specifically in the portion of the LCE adjacent to the interface edge of the heat source 602.

In one embodiment, along a small portion of the shortest thermal path 610 between the interface with the heat source 602 and the interface with the insulated area or body 606, the director orientation of the LCE adjacent to the interface edge with the heat source 602 is orthogonal to the interface edge, thereby creating a highly conductive portion of LCE along the shortest thermal path. This orientation only lasts for some short threshold distance from the interface with the heat source 602. Thus, the shortest thermal path 610 may be configured to guide heat out from the heat source and to spread the heat (and thermal paths) across a greater area of the LCE before shifting the orientation of directors such that the directors turn toward parallel (e.g., tangential) to the interface with the heat source 602 and also parallel (e.g., tangential) to the interface with the insulated body 606. These embodiments of portions of the LCE body near node interfaces and having directors orthogonal to the interface edge of a heat source 602 may be used in instances where heat flows from the heat source require additional thermal paths to carry away the heat from the heat source, such that the directors begin orthogonal to the interface edge with the heat source and after a threshold distance shift their orientation away from the insulator and possibly toward the heat sink 604. This orientation of the directors is orthogonal to the interface edge with the heat source 602 (e.g., around a portion of or around the entire boundary of that heat source node of the thermal circuit, a certain portion to increase heat flow in the vicinity of the LCE immediately adjacent to the heat source). As shown by the map of director orientations, this localized heat flow away from the heat source 602 (e.g., for a threshold distance adjacent to the heat source and along the shortest thermal path 610 between the heat source and the insulated area 606) exists for only the portions of the shortest thermal path 610 directly adjacent to the heat source interface to increase the area of the shortest thermal path to a realistic cross-section needed to carry the heat from the heat source.

This embodiment of orienting a portion of directors orthogonal to the heat source interface in an adjacent portion of the shortest thermal path 610 may be used in certain instances, such as where there exists a large or significant anisotropy between the thermal conductivity of the LCE between parallel and orthogonal director orientations. For example, this embodiment may be used in instances in which there are large heat flow requirements for heat flow out of interface with the heat source 602 and in instances for which there is a large anisotropic thermal conductivity such that heat flows parallel to the orientation of the directors are significantly better than heat flows orthogonally to the orientation of the directors. The orientation of directors orthogonal to the interface edge of the heat source may be used for an interface portion of the LCE to increase localized heat flow across the interface edge at several portions of the interface with the heat sink.

This embodiment of director orientation along the shortest thermal path may therefore be used to avoid heat build-up in portions of the heat source 602 that either could increase the temperature of the heat source outside of operating parameters and/or could create two temperatures along the node interface. If a node has a second temperature, then the node is split into two effective nodes, thereby creating a new thermal path, and possibly a new dominant thermal path, based on the new node temperature. As shown in the embodiment, and described further herein, different decisions may be made about the director orientation along the shortest thermal paths between the nodes based on the conductivity of the LCE body, the magnitude of anisotropy in conductivity between heat flow orthogonal to director orientation and in the direction of director orientation, and the requirements of reduced heat flows to or from the insulated area/body 606.

In some embodiments, the requirements for the shortest thermal path 612 through the LCE body between the heat sink 604 and the insulated body 606 may designed similarly to the shortest heat path 610. For example, the requirements for constraining heat flows along the shortest thermal heat paths 610 and 612 may be similar, particularly in instances where temperature differentials are similar between the nodes, in instances where there are no asymmetric heat flow requirements (e.g., insulated body must be insulated more from the heat source than from the heat sink), and/or in instances where each of the nodes are arranged as shown with the three shortest thermal heat paths having a similar path length. The LCE body contains similar director orientations along shortest thermal path 610 and the shortest thermal path 612 in the embodiment shown, though other design decisions may be made based on different requirements for heat flows.

Figure 7:
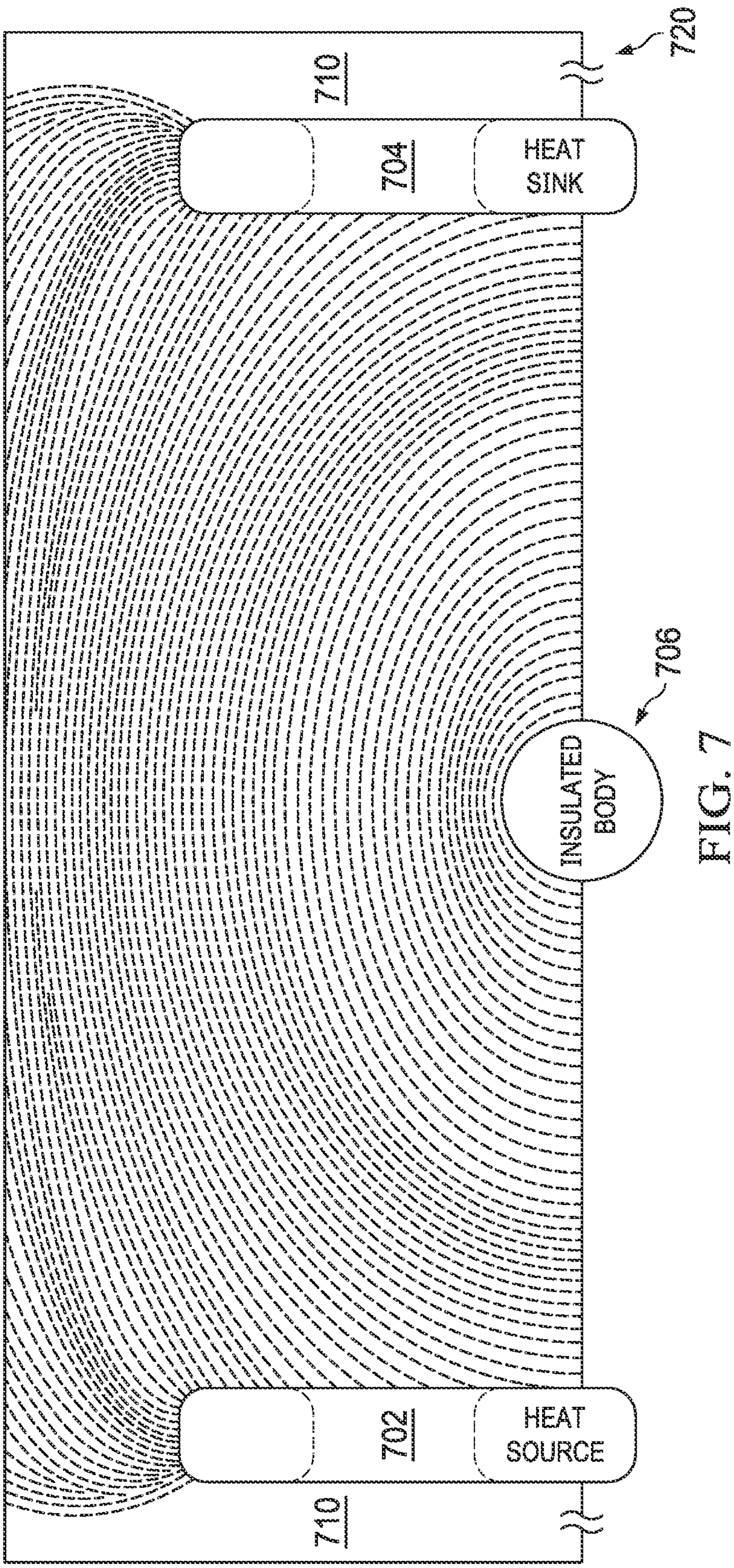
FIG. 7 illustrates an embodiment of a thermal circuit built in an LCE configured for use in embodiments where an insulated body is placed between a heat source and a heat sink.

FIG. 7 shows an embodiment of a thermal circuit built in an LCE body 710 that is configured for use in embodiments where an interface with an insulated body 706 is placed between an interface with a heat source 702 and an interface with a heat sink 704. Certain boundary conditions will create different parameters for designing the director orientation of the LCE body, including the physical boundary conditions of the LCE body such as the physical edge 720 (e.g., interface edge with the environment). As shown, the interface with the insulated body 706 is positioned in between the interface portion with the heat sink 704 and the interface portion with the heat source 702, however the interface with the insulated body is not in the middle of all portions of the interface with the heat source and heat sink interface portion. Therefore, there are different portions of the interface with the heat source 702 and the interface with the heat sink 704 that alternatively have thermal paths through the LCE that are separated by an insulated body 706 and some different portions of those nodes with direct thermal paths passing close to the interface with insulated body.

In several embodiments, physical boundary conditions of the LCE including surrounding boundaries 720 of the LCE body 710 function to constrain the direct thermal paths between the heat source 702 and the heat sink 704. For example, the heat source 702 and the heat sink 704 may have heat flow requirements that are difficult to meet with respect to a number of thermal paths between the two nodes where those number of thermal paths are constrained by the physical limitations of the LCE whether those limits are due to constraints in the plane of FIG. 7 or due to a combination of those in-plane constraints and a constraint on the thickness of the LCE body 710. These physical boundary constraints of the LCE may require further thermal paths that are oriented for conduction but that are neither a straight thermal path nor are they a shortest thermal path.

As shown in the embodiment of the director orientations shown in FIG. 7, the straight and shortest thermal paths between the heat source and heat sink do not include directors that are these are all commonly oriented orthogonally the interface edge for the heat source 702 and/or the interface for the heat sink 704 (e.g., directors that are all oriented along the direct thermal path). In other words, in the embodiment of an LCE body 710, the LCE body includes director orientations chosen for each portion of the LCE body as the result of heightened requirements for limited heat flows to or from the insulated body 706. Therefore, for some embodiments of LCE bodies 710, a primary design consideration is the amount of insulating LCE surrounding the insulated body 706. For example, in each of the portions of LCE body 710 surrounding the insulated body along the bottom of the physical boundary 720 of the LCE, all of the directors are directed tangentially to the insulated body interface (e.g., orthogonal to a shortest thermal path between the insulated body and the heat source, along the LCE body boundary 720). This director orientation extends from the LCE body portions adjacent to the interface with the insulated body 706 along both directions of the lower portion of the LCE boundary 720, thereby extending the insulating configuration to the interface portion with the heat source 702 and to the interface portion with the heat sink 704.

As shown in the embodiment in the FIG. 7, the design constraints prioritizing insulation are just one embodiment that aligns the orientation of the directors always in an insulating direction with respect to the interface with the insulated body 706, for at least a threshold distance from the insulated body, and only allowing the directors to align between the heat source 702 and the heat sink 704 for portions of the LCE where those orientations also align tangentially with the boundary of the insulated body.

In other embodiments, where the heat flow requirements between the heat source 702 and the heat sink 704 outweigh the requirements for the heat flows to or from the insulated body 706, or where a different anisotropy of thermal conductivity causes those requirements to interact differently with the physical constraints of the LCE body 720, the layout of the orientation of the directors in the embodiment shown in FIG. 7 may be changed commensurately with design decisions described further herein.

For example, without changing the physical boundary constraint 720 and without adding more thickness to the LCE body 710, a different embodiment of the director orientations and thermal paths in the LCE may be constructed to meet different heat flow requirements, such as aligning more directors with more direct paths between the heat source 702 and the heat sink 704. These different embodiments of director orientations may be changed further if greater heat flows are allowed to and from the interface with the insulated body 706. Such different designs of the directors may also be obtained for embodiments where the LCE material has a higher thermal conductivity anisotropy between heat flows in different directions. In these embodiments, more of the direct thermal paths may contain directors aligned with those paths including direct thermal paths that are closer to the interface with the insulating body 706 and further down the node interfaces for the heat source 702 and the node interface for the heat sink 704. In such embodiments, heat conduction to and from the insulated body may be sufficiently reduced due to the greater resistivity embodied in the thermal paths that are orthogonal to the director orientation.

In some embodiments, boundary conditions such as physical boundary 720 can create portions of the LCE body 710 that are inconsequential to the heat flows on the dominant thermal paths between the heat source 702 and the heat sink 704. Such portions are shown with no director orientation markings in FIG. 7. These portions of the LCE body 710 that are to the left of the heat source 702 and to the right of the heat sink 704 and are shown without director orientation designations may be unimportant to the heat flows of the thermal circuit between the heat source 702, heat sink 704, and the insulated body 706 because the respective lengths and relative thermal resistivities of the thermal paths are so great in these areas that the heat flows through these portions of the LCE body are negligible. In other words, in the areas of the LCE body 710 that the bear no director orientation marks, the thermal paths are necessarily longer and more thermally resistant than any other thermal paths designated with director orientations based on the boundary conditions. Therefore, the directors in these areas may be oriented for other conditions, such as to route heat between portions of the heat source 702 or between portions of the heat sink 704, thereby thermally stabilizing the node, or to meet some other boundary condition, such as the LCE providing physical support of the nodes at the node interfaces without using an air gap for insulation.

Embodiments described herein may include specification of only some of the node interfaces shown in the FIG. 7 and several of these embodiments may include other combinations of requirements relating to interface edges and related director orientations. For example, one embodiment may be designed for a limited heat flow to the interface with an insulated body, without a specific interface for a heat source and or a specific interface for a heat sink and these nodes may instead be distributed, from an ambient environment, via absorption or emission of radiation, or otherwise partially defined. In some embodiments, the LCE body may include a thermal circuit including only requirements for heat flows along conduction paths between heat source and the heat sink, with a limited or no influence from requirements for an insulated body interface in the LCE body to have low heat flow to or from the heat source and/or the heat sink. In other embodiments, the insulated body may be modeled as distributed, requiring the containment of heat flows between the heat source and the heat sink. In other embodiments, such as described with respect to FIG. 1 and FIG. 5, an insulated body (e.g., air, a fluid) may be distributed around portion of the boundary or on several portions of boundary of the LCE.

In some embodiments, a heat source/sink may include portions that have different temperatures when heat flows are at a certain level. These portions may exhibit different temperatures if they have very high heat flows and/or very different heat flows across the heat source 702 or the heat sink 704. This difference in temperature may mean that multiple heat sources or heat sinks will be included in the design requirements for the thermal circuit built into the LCE body, such as shown by the dashed portions of heat source 702 and heat sink 704. The dashed portions of the heat source 702 and the dashed portions of the heat sink 704 may designate multiple nodes to include in the design solution. The description herein of separate and multiple thermal paths between nodes includes interactions between these multiple nodes with different temperatures and different heat flow requirements. These generic cases have been described herein to include descriptions of solutions for multiple nodes as well as solutions for thermal circuits in LCE containing as few as one distributed node such as an insulator body that is indifferent to other heat flows around the LCE body.

In various embodiments, the present disclosure pertains to a liquid crystal elastomer composition having a liquid crystal elastomer body with a heat sink interface edge that is orthogonal to a director orientation of the liquid crystal elastomer body, where the liquid crystal elastomer body is created by a process disclosed herein. For example, in some embodiments, the process includes extruding a portion of liquid crystal ink through a nozzle, where the extruding thereby applies a shear force to the liquid crystal ink that is: (1) sufficient to align a director orientation of the liquid crystal ink by the shear force; and (2) directed to be orthogonal to the heat sink interface edge of the liquid crystal elastomer body. In various embodiments, the method further includes crosslinking the extruded portion of liquid crystal ink into a portion of liquid crystal elastomer with the director orientation via illuminating with an ultraviolet light the extruded portion of liquid crystal ink after it leaves the nozzle.

In some embodiments, the present discloser pertains to a liquid crystal polymer composition having a liquid crystal polymer body with a heat sink interface edge that is orthogonal to a director orientation of the liquid crystal polymer body, where the liquid crystal polymer body is created by a process disclosed herein. For example, in some embodiments, the process includes placing a liquid crystal mesogen mixture prepared with a non-stoichiometric ratio of functional groups for a Michael addition reaction into contact with a heat sink interface molding surface, reacting the liquid crystal mesogen mixture until the reaction stops due to the non-stoichiometric ratio while the liquid crystal mesogen mixture is in contact with the heat sink interface molding surface, thereby creating a midpoint liquid crystal polymer body with excess unreacted functional groups that contains the heat sink interface edge in contact with the heat sink interface molding surface, straining the liquid crystal polymer body in a direction away from the heat sink interface edge, and exposing the midpoint liquid crystal polymer body with excess unreacted functional groups to a cross-linking stimulus configured to react a population of the excess unreacted functional groups, thereby creating the liquid crystal polymer body with the heat sink interface edge.

In another embodiment, the present disclosure pertains to a liquid crystal polymer composition having a liquid crystal polymer body with an insulator interface edge that is aligned with a director orientation of the liquid crystal polymer body, where the liquid crystal polymer body is created by a process disclosed herein. For example, in some embodiments, the process includes placing a liquid crystal mesogen mixture prepared with a non-stoichiometric ratio of functional groups for a Michael addition reaction into contact with an insulator interface molding surface, reacting the liquid crystal mesogen mixture until the reaction stops due to the non-stoichiometric ratio while the liquid crystal mesogen mixture is in contact with the insulator interface molding surface, thereby creating a midpoint liquid crystal polymer body with excess unreacted functional groups that contains the insulator interface edge in contact with the insulator interface molding surface, straining the liquid crystal polymer body in a direction parallel to the insulator interface edge, and exposing the midpoint liquid crystal polymer body with excess unreacted functional groups to a cross-linking stimulus configured to react a population of the excess unreacted functional groups, thereby creating the liquid crystal polymer body with the insulator interface edge.

Although various embodiments of the present disclosure have been illustrated in the accompanying Drawings and described in the foregoing Detailed Description, it will be understood that the present disclosure is not limited to the embodiments disclosed herein, but is capable of numerous rearrangements, modifications, and substitutions without departing from the spirit of the disclosure as set forth herein.

The term "substantially" is defined as largely but not necessarily wholly what is specified, as understood by a person of ordinary skill in the art. In any disclosed embodiment, the terms "substantially", "approximately", "generally", and "about" may be substituted with "within [a percentage] of" what is specified, where the percentage includes 0.1, 1, 5, and 10 percent.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure. The scope of the invention should be determined only by the language of the claims that follow. The term "comprising" within the claims is intended to mean "including at least" such that the recited listing of elements in a claim are an open group. The terms "a", "an", and other singular terms are intended to include the plural forms thereof unless specifically excluded.

What is claimed is:

1. A liquid crystal elastomer composition comprising:

a liquid crystal elastomer body that includes a thermal circuit that connects a heat source to a heat sink via a plurality of first thermal paths from the heat source to the heat sink through the liquid crystal elastomer body, wherein the plurality of first thermal paths comprises a shortest first thermal path that is aligned with more than a first majority of directors along the shortest first thermal path, wherein the liquid crystal elastomer body covers the heat source and wherein portions of the liquid crystal elastomer body have varying transparencies relative to other portions of the liquid crystal elastomer body;

wherein the thermal circuit of the liquid crystal elastomer body connects the heat source to an insulated body via a plurality of second thermal paths from the heat source to the insulated body through the liquid crystal elastomer body, wherein the plurality of second thermal paths comprises a second thermal path that is orthogonal to more than a second majority of directors along the shortest second thermal path; and wherein the thermal circuit of the liquid crystal elastomer body connects the insulated body to the heat sink via a plurality of third thermal paths from the insulated body to the heat sink through the liquid crystal elastomer body, wherein the plurality of second thermal paths comprises a shortest third thermal path that is orthogonal to more than a third majority of directors of the shortest third thermal path.

2. The liquid crystal elastomer composition of claim 1, wherein the shortest first thermal path between the heat source and the heat sink is longer than the shortest second thermal path between the heat source and the insulated body.

3. The liquid crystal elastomer composition of claim 1, wherein along a portion of the shortest second thermal path that is adjacent to the heat source, the liquid crystal elastomer body comprises directors oriented along the shortest second thermal path.

4. The liquid crystal elastomer composition of claim 1, wherein along a majority portion of the shortest second thermal path through the liquid crystal elastomer body between the heat source and the insulated body, the liquid crystal elastomer body comprises directors that are oriented orthogonally to the shortest second thermal path.

5. The liquid crystal elastomer composition of claim 4, wherein the majority portion of the shortest second thermal path is an uninterrupted portion of the shortest second thermal path that is closer to the insulated body than to the heat source; and wherein the uninterrupted portion of the shortest second thermal path through the liquid crystal elastomer is more transparent than a minority portion of the shortest second thermal path that is separate from the majority portion of the shortest second thermal path.

6. The liquid crystal elastomer composition of claim 5, wherein the uninterrupted portion of the shortest second thermal path is adjacent to the insulated body.

7. The liquid crystal elastomer composition of claim 1, wherein, along a portion of the shortest third thermal path that is adjacent to the heat sink, the liquid crystal elastomer body comprises directors oriented along the shortest third thermal path.

8. The liquid crystal elastomer composition of claim 1, wherein along a majority portion of the shortest third thermal path through the liquid crystal elastomer body between the heat sink and the insulated body, the liquid crystal elastomer body comprises directors that are oriented orthogonally to the shortest third thermal path.

9. The liquid crystal elastomer composition of claim 8, wherein the majority portion of the shortest third thermal path is an uninterrupted portion of the shortest third thermal path that is closer to the insulated body than to the heat sink; and wherein the uninterrupted portion of the shortest third thermal path through the liquid crystal elastomer is more transparent than a minority portion of the shortest third thermal path that is separate from the majority portion of the shortest third thermal path.

10. The liquid crystal elastomer composition of claim 9, wherein the uninterrupted portion of the shortest third thermal path is adjacent to the insulated body.

11. The liquid crystal elastomer composition of claim 1, wherein, along the shortest first thermal path through the liquid crystal elastomer body between the heat source and the heat sink, the liquid crystal elastomer body comprises a monodomain of directors that is directed along the shortest first thermal path.

12. The liquid crystal elastomer composition of claim 1, wherein the first, second, and third majority of directors each denote greater than 50% of directors.

13. The liquid crystal elastomer composition of claim 1, wherein the liquid crystal elastomer composition is incorporated within a flexible electronic or display.

14. The liquid crystal elastomer composition of claim 1, wherein the thermal circuit includes an insulated body node interface portion of the liquid crystal elastomer body; and wherein the insulated body node interface portion contains directors configured to be aligned parallel to an interface edge of the insulated body node interface portion.

15. The liquid crystal elastomer composition of claim 14, further comprising:

a heat sink node interface portion of the liquid crystal elastomer body, wherein the heat sink node interface portion contains directors configured to be aligned orthogonal to an interface edge of the heat sink node interface portion.

16. The liquid crystal elastomer composition of claim 15, wherein the heat sink node interface portion comprises all of the liquid crystal elastomer body that is configured to contact a heat sink.

17. The liquid crystal elastomer composition of claim 14, further comprising:

a heat source node interface portion of the liquid crystal elastomer body, wherein the heat source node interface portion contains directors configured to be aligned orthogonal to an interface edge of the heat source node interface portion.

18. The liquid crystal elastomer composition of claim 17, wherein the heat source node interface portion comprises all of the liquid crystal elastomer body that is configured to contact a heat source.

19. The liquid crystal elastomer composition of claim 14, wherein the insulated body node interface portion comprises all of the liquid crystal elastomer body that is configured to contact an insulated body.

20. The liquid crystal elastomer composition of claim 13, wherein the liquid crystal elastomer composition is at least one of a flexible electronic or display.

* * * * *